(12) United States Patent
Sasaki et al.

(10) Patent No.: US 6,956,236 B1
(45) Date of Patent: Oct. 18, 2005

(54) WIRING, TFT SUBSTRATE USING THE SAME AND LCD

(75) Inventors: Makoto Sasaki, Sendai (JP); Gee Sung Chae, Sendai (JP)

(73) Assignee: LG. Phillips LCD Co., Ltd., Kyoungki-do (KR)

( * ) Notice: Subject to any disclaimer, the term of this patent is extended or adjusted under 35 U.S.C. 154(b) by 0 days.

(21) Appl. No.: 09/555,625

(22) PCT Filed: Dec. 8, 1999

(86) PCT No.: PCT/JP99/06877

§ 371 (c)(1),
(2), (4) Date: Jun. 1, 2000

(87) PCT Pub. No.: WO00/36641

PCT Pub. Date: Jun. 22, 2000

(30) Foreign Application Priority Data

Dec. 14, 1998 (JP) .......................................... 10-375320
Aug. 6, 1999 (JP) .......................................... 11-224692

(51) Int. Cl.[7] ...................... H01L 29/04; H01L 31/036; H01L 31/0376; H01L 23/48; H01L 23/52
(52) U.S. Cl. .......................... 257/72; 257/59; 257/751; 257/753; 257/762
(58) Field of Search .......................... 257/59, 72, 762, 257/751, 753; 438/149, 151, 157, 163, 161, 166; 349/39, 42, 43, 47, 139, 45

(56) References Cited

U.S. PATENT DOCUMENTS

| | | | |
|---|---|---|---|
| 5,153,754 A | * | 10/1992 | Whetten ...................... 349/147 |
| 5,166,085 A | * | 11/1992 | Wakai et al. ................ 438/149 |
| 5,831,283 A | * | 11/1998 | Batey et al. .................. 257/66 |

FOREIGN PATENT DOCUMENTS

| | | | |
|---|---|---|---|
| JP | 53-116089 | * | 10/1978 |
| JP | 3-152807 | | 6/1991 |
| JP | 6-97164 | | 8/1994 |
| JP | 7-170043 | | 7/1995 |
| JP | 8-138461 | | 5/1996 |
| JP | 10-153788 | * | 6/1998 |
| WO | PCT/JP99/06877 | | 3/2000 |

* cited by examiner

*Primary Examiner*—Shouxiang Hu
(74) *Attorney, Agent, or Firm*—Morgan Lewis & Bockius LLP

(57) ABSTRACT

A gate electrode (wiring) (40) having a Cu layer (40a) surrounded by a coating film (40b) made of titanium or titanium oxide; a TFT substrate (31) comprising the gate electrode (wiring) (40) and a LCD comprising a pair of opposing substrates and a liquid crystal disposed between the opposing substrates, wherein one of the pair of opposing substrates is a TFT substrate (31), are disclosed.

3 Claims, 27 Drawing Sheets

WIRING, TFT SUBSTRATE USING THE SAME AND LCD

TECHNICAL FIELD

The present invention relates to a wiring using low-resistance Cu as a material for forming an electrode or wiring, TFT (thin film transistor) substrate using the same, manufacturing method of the TFT substrate, and LCD (liquid crystal display).

BACKGROUND ART

As generally known, a TFT substrate is used for manufacturing an LCD.

FIGS. 33 and 34 show the structure of an example of the general TFT substrate, where gate wiring G, source wiring S, and the like are formed on substrate 86. In this structure, the gate wiring G and source wiring S are arranged in a matrix form on a transparent substrate 86 made of a glass material or the like. Each area surrounded by gate wiring G and source wiring S is a pixel (or picture element) portion 81, and TFT 83 is provided in each pixel portion 81.

The TFT 83 has a known etching-stopper type structure in which (i) gate insulating film 89 is provided on gate wiring G made of a conductive material such as aluminium (Al) or aluminium alloy (Al alloy), and on gate electrode 88 connected to the gate wiring G, (ii) semiconductor active film 90 formed by using amorphous silicon (a-Si) is placed over the gate insulating film 89 in a manner such that the semiconductor active film 90 and gate electrode 88 face each other via the insulating film 89, and (iii) drain electrode 91 and source electrode 92, each made of a conductive material such as Al or Al alloy, are formed on the semiconductor active film 90 opposite to each other.

In addition, ohmic contact films 90a, 90a are provided on either side of the semiconductor active film 90, where each ohmic contact film is made using amorphous silicon (a-Si) doped with high-density donor impurities such as phosphorus (P). Therefore, the etching stopper 93 is surrounded by drain electrode 91 and source electrode 92 provided on the ohmic contact films 90a, 90a, and by the semiconductor active film 90. Furthermore, transparent pixel electrode 95 made of indium tin oxide (abbreviated as "ITO", hereinbelow) is provided to cover the upper surface of the drain electrode 91 and the area at the right side of the drain electrode.

In addition, passivation film 96 is provided over the gate insulating film 89, transparent pixel electrode 95, drain electrode 91, source electrode 92, and the like. On the passivation film 96, an oriented film (not shown) is formed, on which a liquid crystal is disposed, so that an active matrix LCD is provided. In the LCD, the orientation of the molecules of the liquid crystal can be controlled by applying an electric field to the molecules by using the transparent pixel electrode 95.

A method of manufacturing the TFT substrate as shown in FIGS. 33 and 34 will be explained. First, an Al or Al alloy thin-film layer is deposited on glass substrate 86 by using a general thin-film layer forming method such as a sputtering method, in which DC (direct current) power is applied to a target made of Al or Al alloy. In the next step, gate electrode 88 is formed by removing unnecessary Al or Al alloy portions outside the target Al or Al alloy portions necessary for forming the gate by using a photolithography method. In the following step, gate insulating film 89 made by using $SiO_2$, $SiN_x$, or the like, semiconductor active film 90, and etching stopper 93 are formed using a thin-film forming method such as the CVD method. In the next step, the ohmic contact film 90a, drain electrode 91, and source electrode 92 are formed on the portions formed in the previous step, by using the above-mentioned sputtering method and photolithography method. The formed drain electrode 91 and source electrode 92 are then masked, and a portion of the ohmic contact film 90a is removed so as to divide the ohmic contact film 90a into two portions. In the final step, passivation film 96 is formed using the CVD method or the like, thereby obtaining a TFT substrate.

Recently, the drive or control speed of the LCD has improved, and accordingly, a problem relating to delays of signal transmission due to resistance of some electrodes and wiring, such as the gate electrode, gate wiring, source wiring, and drain wiring, has become obvious. In order to solve the problem, using cupper for forming electrodes and wiring, whose resistance is lower than that of Al or Al alloy, has been examined. Such a copper (Cu) wiring can be formed by a method similar to that used for forming a wiring made of Al or Al alloy, that is, a Cu layer is formed using a general sputtering method, and unnecessary portions of the Cu layer outside a target portion for forming the wiring are removed by using the photolithography method.

However, generally, Cu is easily affected by chemicals. Therefore, if Cu is used as a material for forming electrodes such as gate electrode 88 and wiring such as gate wiring G (abbreviated as "wiring material", hereinbelow) in the LCD comprising a TFT substrate having the structure as shown in FIGS. 33 and 34, then when an etching material having the oxidizing capability (used for etch another layer in the latter process) is soaked into the Cu layer, the Cu layer may be etched and thus damaged. If the Cu layer is severely damaged, the Cu layer may be detached from the base substrate 86, or wiring may be broken or disconnected. Therefore, the possible etching material is limited.

In addition, if Cu is used as the wiring material, when the resist-detaching solvent used in the photolithography process soaks into the Cu film, the Cu film may be corroded by the solvent.

In the etching of the Cu film, the surface of the Cu film is oxidized. If an oxide layer of CuO, $Cu_2O$, or the like is generated on the surface of the Cu film due to water or oxygen included in the air before the etching is performed, then the Cu film is etched and damaged even when an etching material having no oxidizing capability is used, and the wiring is broken and disconnected. Therefore; a Cu alloy may be used as a Cu wiring material for preventing the generation of such an oxide layer of CuO, $Cu_2O$, or the like (on the surface of the Cu film). However, the wire resistance of the Cu alloy is larger than that of Cu; thus, a satisfactory effect obtained by using a material having a lower resistance is not expected in this case.

If gate electrode 88 is formed using a Cu film, Cu (atoms) may disperse into the gate insulating film 89, so that the withstand voltage may be degraded. In addition, if the substrate 86b is made of a glass material, Si (atoms) in the substrate 86 may be incorporated in the gate electrode 88, thereby increasing the resistance of the gate electrode 88.

If the drain electrode 91 and source electrode 92 are formed using Cu films, elements of electrodes 91 and 92, and semiconductor active film 90 disperse between each portion, so that the performance of the semiconductor active film 90 may be degraded.

DISCLOSURE OF THE INVENTION

In consideration of the above circumstances, the objective of the present invention is to provide a wiring using a Cu wiring material which has a low resistance, TFT substrate using the same, manufacturing method of the TFT substrate, and LCD, by which (i) oxidation resistance against water or oxygen, (ii) corrosion resistance against the etching material, resist-detaching solvent, and the like, and (iii) adhesion to the base can be improved, and inter-dispersion of the elements between adjacent films can be prevented.

To achieve the above objective, the present invention provides a wiring comprising a Cu (copper) layer surrounded by a coating film made of titanium or titanium oxide. A specific example of the coating film has the composition ratio of the number of titanium atoms to the number of oxygen atoms of "1 to 0" to "1 to 2". More specifically, a titanium coating film or a titanium oxide coating film may be used.

The present invention also provides a wiring comprising a Cu layer surrounded by a coating film made of molybdenum or molybdenum oxide. A specific example of the coating film has the composition ratio of the number of molybdenum atoms to the number of oxygen atoms of "1 to 0" to "1 to 3". More specifically, a molybdenum coating film or a molybdenum oxide coating film may be used.

The present invention also provides a wiring comprising a Cu layer surrounded by a coating film made of chromium or chromium oxide. A specific example of the coating film has the composition ratio of the number of chromium atoms to the number of oxygen atoms of "1 to 0" to "1 to 2". More specifically, a chromium coating film or a chromium oxide coating film may be used.

The present invention also provides a wiring comprising a Cu layer surrounded by a coating film made of tantalum or tantalum oxide. A specific example of the coating film has the composition ratio of the number of tantalum atoms to the number of oxygen atoms of "1 to 0" to "1 to 2.5". More specifically, a tantalum coating film or a tantalum oxide coating film may be used.

Preferably, the thickness of the coating film surrounding the Cu film is approximately 5 to 30 nm, more preferably, 5 to 20 nm. If the thickness of the coating film is less than 5 nm, that is, too thin, then (i) oxidation resistance against water or oxygen, and (ii) corrosion resistance against the etching material, resist-detaching solvent, and the like, cannot be significantly improved. Additionally, in this case, inter-dispersion of the elements between adjacent films may occur. In contrast, if the thickness of the coating film is larger than 30 nm, much more remarkable effects cannot be obtained (that is, the possible effects are saturated), and the time necessary for forming the film increases and the wiring resistance also increases.

If the wiring has the Cu layer and the coating film made of titanium or titanium oxide, the coating film may comprise a titanium film and a film made of a titanium oxide, a specific example thereof having a titanium film and a film having the composition ratio of the number of titanium atoms to the number of oxygen atoms of "1 to 1" to "1 to 2".

If the wiring has the Cu layer and the coating film made of titanium or titanium oxide, the coating film may comprise a titanium film formed around the Cu layer, and a film which is made of titanium oxide and is formed on the surface of the titanium film, a specific example thereof having a titanium film formed around the Cu layer, and a film which is formed on the surface of the titanium film and has the composition ratio of the number of titanium atoms to the number of oxygen atoms of "1 to 1" to "1 to 2".

If the wiring has the Cu layer and the coating film made of titanium or titanium oxide, the coating film may comprise a titanium film provided at a portion of the circumferential area of the Cu layer, and a film which is provided at the remaining portion of the circumferential area of the Cu layer and is made of titanium oxide, a specific example thereof having a titanium film provided at a portion of the circumferential area of the Cu layer, and a film which is provided at the remaining portion of the circumferential area of the Cu layer and has the composition ratio of the number of titanium atoms to the number of oxygen atoms of "1 to 1" to "1 to 2".

If the wiring has the Cu layer and the coating film made of chromium or chromium oxide, the coating film may comprise a chromium film and a film made of a chromium oxide, a specific example thereof having a chromium film and a film having the composition ratio of the number of chromium atoms to the number of oxygen atoms of "1 to 1" to "1 to 2".

If the wiring has the Cu layer and the coating film made of chromium or chromium oxide, the coating film may comprise a chromium film formed around the Cu layer, and a film which is made of chromium oxide and is formed on the surface of the chromium film, a specific example thereof having a chromium film formed around the Cu layer, and a film which is formed on the surface of the chromium film and has the composition ratio of the number of chromium atoms to the number of oxygen atoms of "1 to 1" to "1 to 2".

If the wiring has the Cu layer and the coating film made of chromium or chromium oxide, the coating film may comprise a chromium film provided at a portion of the circumferential area of the Cu layer, and a film which is provided at the remaining portion of the circumferential area of the Cu layer and is made of chromium oxide, a specific example thereof having a chromium film provided at a portion of the circumferential area of the Cu layer, and a film which is provided at the remaining portion of the circumferential area of the Cu layer and has the composition ratio of the number of chromium atoms to the number of oxygen atoms of "1 to 1" to "1 to 2".

In order to solve the above problems, the present invention also provides a TFT substrate employing a wiring having the structure as explained above.

The present invention also provides a TFT substrate comprising a base and a wiring as explained above which is formed on the base via a TiN film.

The present invention also provides a TFT substrate comprising a base and a wiring comprising a Cu layer and a coating film made of titanium or titanium oxide which is formed on the surface of the Cu layer, wherein the wiring is provided on the base via a TiN film. A specific example of the coating film made of titanium or titanium oxide has the composition ratio of the number of titanium atoms to the number of oxygen atoms of "1 to 0" to "1 to 2".

In the TFT substrate comprising a base and a wiring comprising a Cu layer and a coating film made of titanium or titanium oxide which is formed on the surface of the Cu layer, the wiring may be provided on the base via a TiN film. The coating film of the wiring may include a titanium film formed on the surface of the Cu layer, and a film which is made of titanium oxide and is formed on the surface of the titanium film. A specific example of the coating film made of titanium oxide has the composition ratio of the number of titanium atoms to the number of oxygen atoms of "1 to 1" to "1 to 2".

Preferably, the thickness of the TiN film is approximately 10 to 50 nm. With a TIN film having a thickness of less than 10 nm, if the above coating film functioning as a barrier layer is not formed between the Cu film (of the wiring) and the base, or if the coating film does not have a sufficient thickness, then it is impossible to obtain a sufficient effect of preventing elements dispersed from the base or an adjacent film made of $SiO_2$, SiON, $SiO_x$, or the like, from being incorporated into the wiring. On the other hand, with a thick TiN film having a thickness of more than 50 nm, much more remarkable effects cannot be obtained (that is, the possible effects are saturated), and the time necessary for forming the film increases.

In the wiring having the above-explained structure, (i) the coating film, formed around the Cu layer, functions as a protective layer against a chemical solution such as a resist-detaching solvent or an etchant, or water, or as a barrier layer for preventing the inter-dispersion of the elements between adjacent films, or (ii) the coating film, formed on the surface of the Cu layer, functions as a protective layer against a chemical solution such as a resist-detaching solvent or an etchant, or water.

According to the TFT substrate (of the present invention) comprising the wiring as explained above, even if an etching material having the oxidizing capability, used in a latter process for etching other layers, soaks into the Cu wiring, the wiring is not easily damaged by the etching material because the above coating film functioning as a protective layer is formed around or on the Cu layer. Therefore, it is possible to prevent the wiring from being detached from the base, and breaking of wiring can also be prevented and the etching material to be used is less limited.

In addition, even if a resist-detaching solvent used in the photolithography process soaks into the wiring, the corrosion of the wiring caused by the resist-detaching solvent can be prevented because the above coating film functioning as a protective layer is formed around or on the Cu layer.

As the wiring according to the present invention has the coating film around or on the Cu layer, no oxide layer due to presence of water is generated on the surface of the wiring before the etching. Therefore, the wiring is not easily damaged by an etching material having no oxidizing capability, and thus breaking of wiring can be prevented. In addition, as the coating film functioning as a barrier layer is formed around the Cu layer, even if elements disperse from an adjacent film, the dispersed atoms are blocked by the coating film and cannot be incorporated in the wiring. Therefore, it is possible to prevent an increase of the wiring resistance caused by the dispersion of the elements from an adjacent film. Furthermore, dispersion of Cu atoms in the Cu layer to an adjacent film can also be prevented by the above coating film. Therefore, it is possible to prevent degradation of withstand voltage caused by the dispersion of Cu atoms from the Cu layer, and degradation of the performance of a semiconductor active film.

In addition, as the coating film functioning as a barrier layer is formed around the Cu layer in the wiring, even if elements disperse from an adjacent film at the upper or right or left side of the wiring (i.e., of the coating film), the dispersed atoms are blocked by the coating film and cannot be incorporated in the wiring. Therefore, it is possible to prevent an increase of the wiring resistance caused by the dispersion of the elements from an adjacent film. Furthermore, dispersion of Cu atoms in the Cu layer to an adjacent film at the upper or right or left side of the wiring can also be prevented by the above coating film. Therefore, it is possible to prevent degradation of withstand voltage caused by the dispersion of Cu atoms from the Cu layer, and degradation of performance of a semiconductor active film.

In addition, as the circumferential area or the surface of the Cu layer is covered with the above coating film, when an insulating film or passivation film made of silicon oxide is formed on the wiring by using the CVD method or the like, it is possible to prevent a reaction between Cu of the Cu film and the $SiH_4$ gas used for forming the insulating film or the like. Therefore, it is possible to prevent generation of needlelike protrusions on the Cu layer (caused by such a chemical reaction), and to prevent degradation of insulation resistance caused by such needle-like protrusions.

Even if the wiring according to the present invention directly contacts a pixel electrode made of a transparent conductive film such as ITO or IZO, the wiring is not oxidized by the oxygen in the ITO or IZO (it is oxidized if aluminium is used as the wiring material); therefore, the contact resistance with respect to ITO or IZO is low.

In the TFT substrate (according to the present invention) comprising a TiN film between the wiring and the base, even if the coating film functioning as a barrier layer is not provided between the lower face of the Cu layer (as a constituent of the wiring) and the base, or if the coating film (provided between the lower face of the Cu layer and the base) is not sufficiently thick, elements (i.e., atoms) dispersed from the base or an adjacent film towards the wiring can be blocked by the TiN film. Therefore, it is possible to effectively prevent an increase of the wiring resistance caused by the element dispersion from the base or an adjacent film. The adhesion of the wiring can also be improved by the TiN film.

According to the TFT substrate of the present invention, (i) oxidation resistance against water or oxygen, and (ii) resistance against the etching material, resist-detaching solvent, and the like can be improved while the characteristics obtained by using Cu (having low resistance) as the wiring material are maintained. Therefore, the adhesion to the base can be improved, breakage of wiring and corrosion are prevented, the etching material to be used is less limited, and the processes after the wiring is formed are less limited. In addition, inter-dispersion of the elements between adjacent films can be prevented, thereby providing a TFT substrate having desirable withstand voltage and desirable characteristics of the semiconductor active film.

The present invention also provides a method of manufacturing a TFT substrate, comprising the steps of:

forming a Cu film on a metallic film by using a target made of Cu, wherein the metallic film is formed on a base and is made of a metal selected from the group consisting of titanium, molybdenum, chromium, and tantalum;

patterning-processing the Cu film and the metallic film to make a wiring having a desired shape; and annealing-processing the base so as to form a metallic coating film on the patterning-processed Cu film, wherein the metallic coating film is made of a metal selected from the group consisting of titanium, molybdenum, chromium, and tantalum.

In the above method, the annealing-process is performed at approximately 400 to 1200° C., and for about 30 minutes to 1 hour. At annealing temperature of less than 400° C., the temperature is too low and elements in the metallic film cannot be sufficiently incorporated in the Cu film for forming a necessary wiring. At an annealing temperature of more than 1200° C., the temperature is too high, and the Cu film melts and Cu wiring having a low resistance cannot be formed.

According to the above TFT substrate manufacturing method of the present invention, a TFT substrate comprising a wiring having the above-explained structure according to the present invention can be manufactured. The step of forming a Cu film on a metallic film by using a target made of Cu, wherein the metallic film is formed on a base and is made of a metal selected from the group consisting of titanium, molybdenum, chromium, and tantalum may be performed using a two-frequency excited sputtering apparatus, in a non-oxide atmosphere. According to this step, the elements in the metallic film can be incorporated in the Cu film. After that, the Cu layer is formed by the step of patterning-processing the Cu film and the metallic film to make a wiring having a desired shape, and the base is then annealing-processed. Accordingly, the metal elements incorporated in the Cu film disperse towards the surface of the Cu layer, thereby forming the metallic coating film, made of a metal selected from among titanium, molybdenum, chromium, and tantalum, around the Cu layer. Therefore, the elements of the metallic film formed on the base are incorporated in the Cu film while the Cu film is formed, and the base is then annealing-processed, so that the elements of the metallic film are dispersed towards the surface of the Cu layer and a coating film functioning as the protective layer or barrier layer is formed. Accordingly, in comparison with the case of depositing such a coating film on the Cu layer by using a sputtering method or the like, the wiring can be thinner, and even with a thin coating film (of the wiring), the oxidation resistance against water or oxygen, and the acid resistance against the etching material, or the like can be sufficiently improved, as described above.

The present invention also provides a method of manufacturing a TFT substrate, comprising the steps of:

forming a TiN film on a base;

forming a film made of titanium or titanium oxide on the TIN film;

forming a Cu film on the film made of titanium or titanium oxide by using a target made of Cu, so that a multi-layered film is formed;

patterning-processing the multi-layered film to make a wiring having a desired shape; and annealing-processing the base so as to form a coating film made of titanium or titanium oxide on the patterning-processed Cu film.

A specific example of the film made of titanium or titanium oxide has the composition ratio of the number of titanium atoms to the number of oxygen atoms of "1 to 0" to "1 to 2". A specific example of the coating film made of titanium or titanium oxide has the composition ratio of the number of titanium atoms to the number of oxygen atoms of "1 to 0" to "1 to 2".

In the above method, the annealing-process are performed at approximately 300 to 1200° C., and for about 30 minutes to 1 hour. At annealing temperature of less than 300° C., the temperature is too low and elements in the metallic film cannot be sufficiently incorporated in the Cu film for forming a necessary wiring, so that a desirable coating film made of titanium or titanium oxide cannot be formed on the Cu layer. At annealing temperature of more than 1200° C., the temperature is too high and the Cu film melts and Cu wiring having a low resistance cannot be formed.

According to the above TFT substrate manufacturing method, a TFT substrate comprising the wiring (having the above-explained structure according to the present invention) via the TiN film can be manufactured. On a film made of titanium or titanium oxide formed on the base via a TiN film, a Cu film can be formed by using a target made of Cu, and by using a two-frequency excited sputtering apparatus, in a non-oxide atmosphere. Accordingly, the elements in the film made of titanium or titanium oxide can be incorporated in the Cu film. After that, the Cu layer is formed by the step of patterning-processing the multi-layered film consisting of the film made of titanium or titanium oxide and the Cu film so as to make a wiring having a desired shape, and the base is then annealing-processed. Accordingly, the titanium elements incorporated in the Cu film disperse towards the surface of the Cu layer, thereby forming the coating film, which is made of titanium or titanium oxide and functions as the protective or barrier layer, on or around the Cu layer. Such a coating film for the wiring of the TFT substrate may be formed around the Cu layer or on the surface of the Cu layer. Each arrangement can be obtained by controlling the thickness of the film made of titanium or titanium oxide, or conditions of the annealing process (of the base) such as the annealing temperature.

Also in the above TFT substrate manufacturing method, preferably, the thickness of the film made of titanium or titanium oxide formed on the TiN film is 10 to 20 nm. With a thickness (of the film made of titanium or titanium oxide) of 20 nm or less, the increase of the resistance is small and remarkable effects can be obtained by using Cu as the wiring material. With a thickness (of the film made of titanium or titanium oxide) of more than 30 nm, the resistance increases as much as the case when Al is used as the wiring material; thus, using Cu no longer has any meaning. With a thickness (of the film made of titanium or titanium oxide) of less than 10 nm, the number of titanium elements dispersing towards the surface of the Cu layer by the annealing is small; thus the coating film, which is made of titanium or titanium oxide and has the composition ratio of the number of titanium atoms to the number of oxygen atoms of "1 to 0" to "1 to 2", is thin and sufficient effects as the protective or barrier layer cannot be obtained.

In the above TFT substrate manufacturing method, a titanium oxide layer, which is generated on the surface of the film made of titanium or titanium oxide before the Cu film is formed, may be removed by plasma etching. Accordingly, the temperature of the annealing process of the base (performed for dispersing the titanium elements incorporated in the Cu film towards the surface of the Cu layer) can be decreased.

Either TFT substrate manufacturing method as explained above may include the step of forming a Cu film on (i) a base on which a metallic film is formed, or (ii) a base on which a film made of titanium or titanium oxide is formed via a TiN film, by using the two-frequency excited sputtering method; the step of patterning the Cu film; and the step of annealing the base. Therefore, the wiring according to the present invention can be easily formed on the base and the manufacturing processes are not complicated.

In addition, in each TFT substrate manufacturing method, the wiring according to the present invention can be formed on the base at a low temperature; thus, the present method can be applied to a case using a glass substrate which cannot tolerate heating at 600° C. or more.

In each TFT substrate manufacturing method, the coating film may include oxygen.

If the atmosphere in the annealing process includes no oxygen, a coating film having 0 atom % of the content of the oxygen atoms can be obtained. In addition, the percentage content of the oxygen atoms in the coating film can be gradually increased by gradually increasing the partial pressure of oxygen in the atmosphere in the annealing process.

The present invention also provides an LCD comprising a pair of opposing substrates and a liquid crystal disposed between the opposing substrates, wherein one of the pair of opposing substrates is the TFT substrate according to the present invention.

The LCD of the present invention comprises the TFT substrate using a Cu wiring having a low resistance; thus, signal-voltage drop due to the wiring resistance and signal delay relating to wiring do not easily occur, and it is possible to easily provide a display suitable for a wide-area display using longer wiring, or for a fine display using thinner wiring. In addition, the wiring is not easily detached from the base, breakage of wiring and corrosion are prevented, and inter-dispersion of the elements between adjacent wiring and film is prevented in the TFT substrate; thus, an LCD having preferable performance can be provided.

MODES FOR CARRYING OUT THE INVENTION

Hereinbelow, preferred embodiments of the present invention will be explained in detail; however, the present invention is not limited to these embodiments.

First Embodiment

Figure 1:
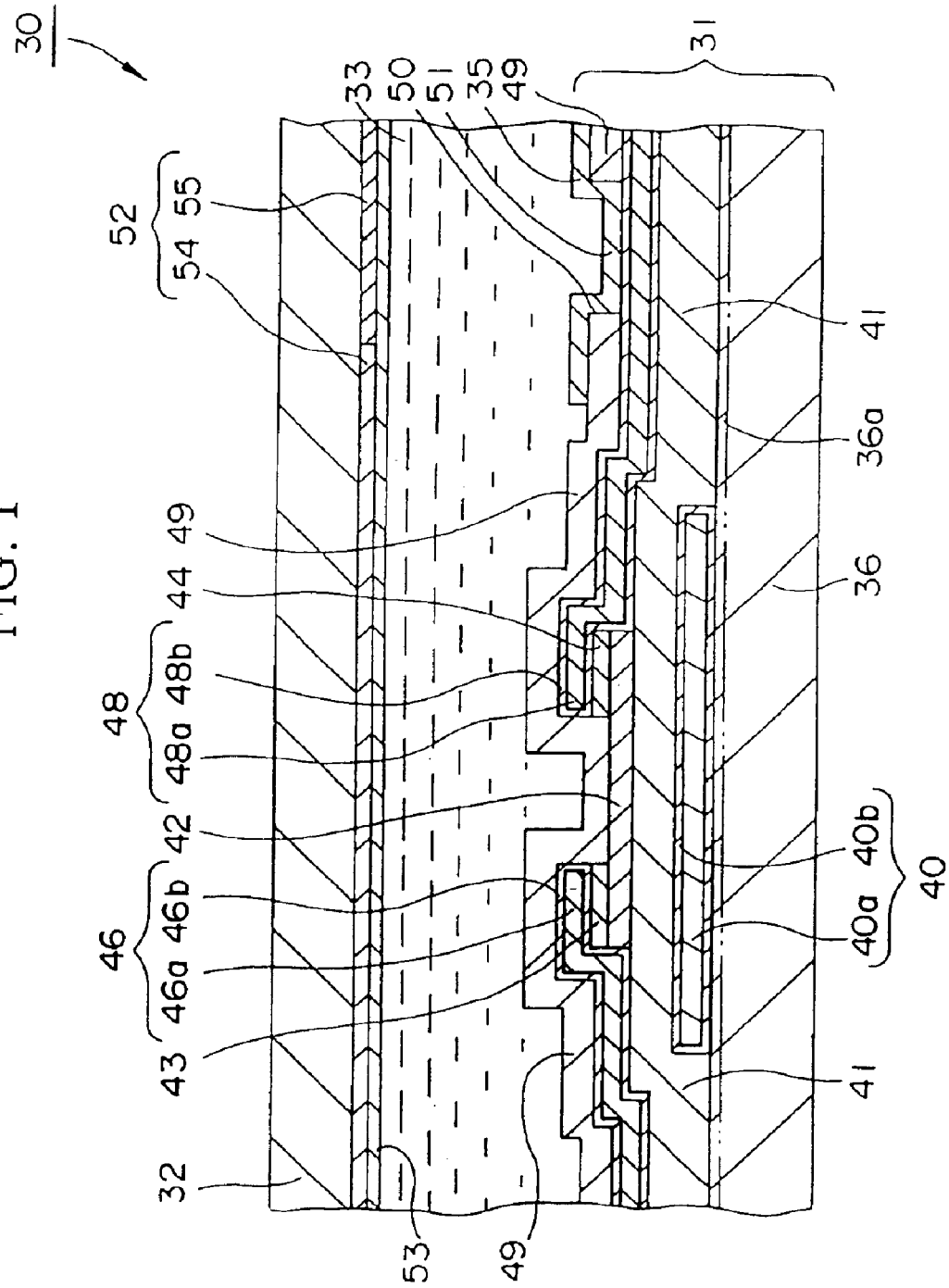
FIG. 1 is a view showing the cross-sectional structure of the first embodiment of the LCD and the TFT substrate according to the present invention.

FIG. 1 shows a distinctive portion of the first embodiment of the LCD according to the present invention. The LCD 30 of this embodiment comprises bottom-gate type TFT substrate 31 as an embodiment of the TFT substrate of the present invention, transparent opposing substrate 32 separate from and parallel to the TFT substrate 31, and liquid crystal layer 33 enclosed between the TFT substrate 31 and opposing substrate 32.

Figure 33:
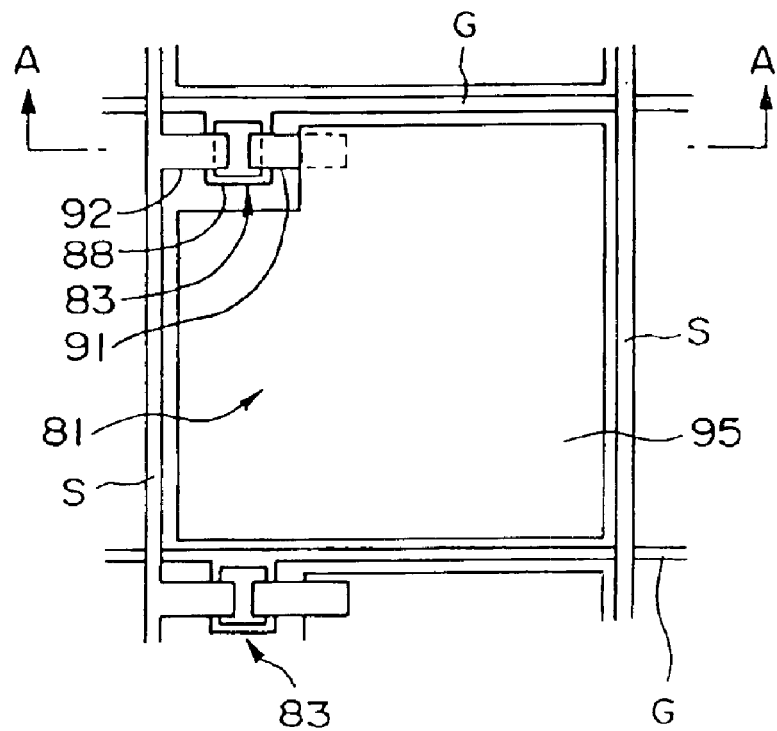
FIG. 33 is a general plan showing the pixel portion in an example TFT substrate provided in a conventional LCD.
Figure 34:
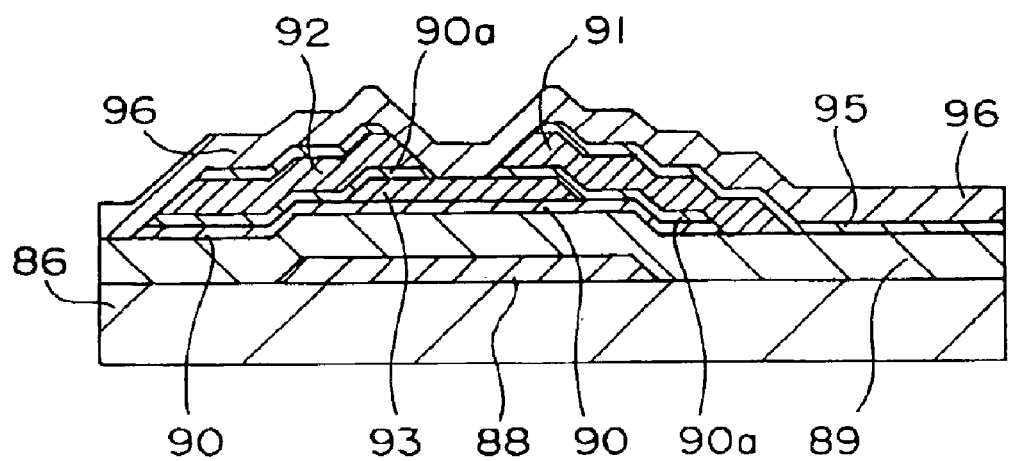
FIG. 34 is a cross-sectional view showing the TFT substrate of FIG. 33.

Similar to the conventional structure shown in FIG. 33, in the TFT substrate 31, several source wiring lines arranged in each column direction of a matrix structure (present in a plan observed from the upper face side of the opposing substrate 32) and several gate wiring lines in each row direction of the matrix structure cross each other. In this structure, each area surrounded by the wiring of adjacent sources and gates is called a pixel portion. In each pixel portion, pixel electrode 35 made of a transparent conductive material such as ITO (indium tin oxide) is provided. A bottom-gate type TFT is provided in the vicinity of each pixel electrode 35.

FIG. 1 is an enlarged view showing the TFT provided in an area corresponding to a pixel portion (surrounded by the source and gate wiring lines) and the vicinity of the TFT. Several pixel portions are arranged on TFT substrate 31 so as to form a display screen as LCD 30.

In each pixel portion of this type of TFT substrate 31, (i) gate electrode 40 is provided on substrate (base) 36, at least the surface of which (substrate) is insulated, (ii) gate insulating film 41 is provided over the gate electrode 40 and substrate 36, (iii) semiconductor active film 42 is further deposited on the gate insulating film 41 (provided on the gate electrode 40), where the film 42 is smaller than the gate electrode (wiring) 40, and (iv) ohmic contact films 43 and 44 made by using the n$^+$ layer or the like are provided on either end side of the semiconductor active film 42, where the films 43 and 44 are separated from each other, and each end position of the semiconductor active film 42 agrees with one end position (the side farer from the opposing ohmic contact film) of each ohmic contact film. A glass substrate or a substrate on which SiN$_x$ film 36a is formed may be used as substrate 36.

The gate electrode 40 has a Cu (copper) layer 40a which is coated by coating film 40b. The material of coating film 40b is one of (i) titanium or titanium oxide, (ii) molybdenum or molybdenum oxide, (iii) chromium or chromium oxide, and (iv) tantalum or tantalum oxide.

A specific example of the coating film made of (i) titanium or titanium oxide has the composition ratio of the number of titanium atoms to the number of oxygen atoms of "1 to 0" to "1 to 2".

A specific example of the coating film made of (ii) molybdenum or molybdenum oxide has the composition ratio of the number of molybdenum atoms to the number of oxygen atoms of "1 to 0" to "1 to 3".

A specific example of the coating film made of (iii) chromium or chromium oxide has the composition ratio of the number of chromium atoms to the number of oxygen atoms of "1 to 0" to "1 to 1.5".

A specific example of the coating film made of (iv) tantalum or tantalum oxide has the composition ratio of the number of tantalum atoms to the number of oxygen atoms of "1 to 0" to "1 to 2.5".

In contrast, the above coating film 40b may comprise a titanium film and a film made of a titanium oxide, a specific example thereof having a titanium film and a film having the composition ratio of the number of titanium atoms to the number of oxygen atoms of "1 to 1" to "1 to 2".

Figure 2:
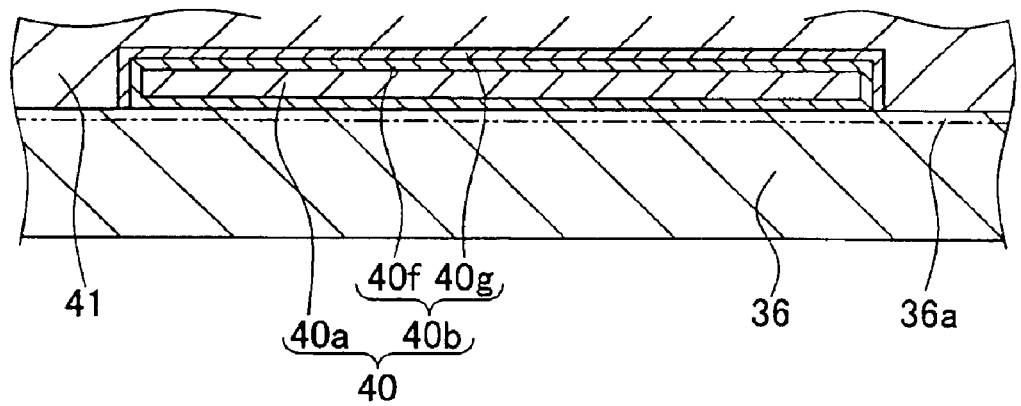
FIG. 2 is an enlarged cross-sectional view showing another example of the gate electrode provided in the TFT substrate in FIG. 1.

A more specific example shown in FIG. 2 has titanium film 40f provided around Cu layer 40a, and film 40g which is provided on the surface of titanium film 40f and is made of a titanium oxide which has the composition ratio of the number of titanium atoms to the number of oxygen atoms of "1 to 1" to "1 to 2".

Figure 3:
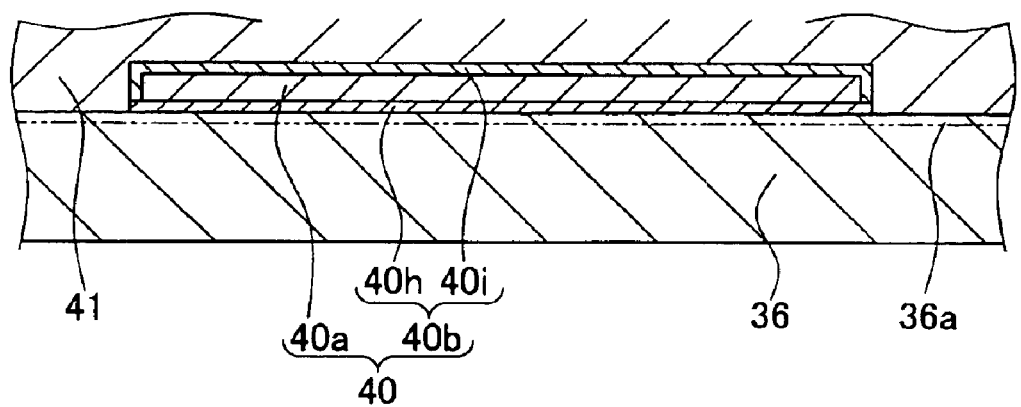
FIG. 3 is an enlarged cross-sectional view showing another example of the gate electrode provided in the TFT substrate in FIG. 1.

Another specific example shown in FIG. 3 has titanium film 40h provided at a portion of the circumferential area of Cu layer 40a, and film 40i which is provided at the remaining portion of the circumferential area of Cu layer 40a and is made of a titanium oxide which has the composition ratio of the number of titanium atoms to the number of oxygen atoms of "1 to 1" to "1 to 2".

On the other hand, the above coating film 40b may comprise a chromium film and a film made of a chromium oxide, a specific example thereof having a chromium film and a film having the composition ratio of the number of chromium atoms to the number of oxygen atoms of "1 to 1" to "1 to 2".

A more specific example has a chromium film provided around Cu layer 40a, and a film which is provided on the surface of the chromium film and is made of a chromium oxide which has the composition ratio of the number of chromium atoms to the number of oxygen atoms of "1 to 1" to "1 to 2".

Another specific example has a chromium film provided at a portion of the circumferential area of Cu layer 40a, and a film which is provided at the remaining portion of the circumferential area of Cu layer 40a and is made of a chromium oxide which has the composition ratio of the number of chromium atoms to the number of oxygen atoms of "1 to 1" to "1 to 2".

Source electrode 46 is provided over (i) the upper and left-side faces of ohmic contact film 43 (one of the ohmic contact films which is farer from the pixel electrode 35 shown in FIG. 1), (ii) the left-side face of the semiconductor active film 42 under the ohmic contact film 43, and (iii) a portion of the upper face of the gate insulating film 41 contacting the semiconductor active film. That is, the overlapped portion of the semiconductor active film 42 and ohmic contact film 43 is covered with the source electrode 46. The source electrode 46 has Cu layer 46a coated with coating film 46b. The composition of the coating film 46b is similar to that of coating film 40b of the gate electrode 40. In addition, similar to the coating film 40b of the gate electrode 40, the coating film 46b may comprise a titanium film and a film made of a titanium oxide which has, for example, the composition ratio of the number of titanium atoms to the number of oxygen atoms of "1 to 1" to "1 to 2".

In contrast, drain electrode 48 is provided over (i) the upper and right-side faces of ohmic contact film 44 (one of the ohmic contact films which is nearer to the pixel electrode 35 shown in FIG. 1), (ii) the right-side face of the semiconductor active film 42 under the ohmic contact film 44, and (iii) a portion of the upper face of the gate insulating film 41 contacting the semiconductor active film. That is, the overlapped portion of the semiconductor active film 42 and ohmic contact film 44 is covered with the drain electrode 48. The drain electrode 48 has Cu layer 48a coated with coating film 48b. The composition of the coating film 48b is similar to that of coating film 40b of the gate electrode 40. In addition, similar to the coating film 40b of the gate electrode 40, the coating film 48b may comprise a titanium film and a film made of a titanium oxide which has, for example, the composition ratio of the number of titanium atoms to the number of oxygen atoms of "1 to 1" to "1 to 2".

The top face of these layered films is covered with passivation film 49. A pixel electrode 35 is provided on the passivation film 49, and on the right end of the drain electrode 48. The pixel electrode 35 is connected to the drain electrode 48 via connection conductor 51 provided in the contact hole (i.e., conduction hole) 50 formed in the passivation film 49.

On the other hand, at the liquid crystal side of the opposing substrate 32 opposed to the TFT substrate 31, color filter 52 and common electrode film 53 are deposited on the opposing substrate 32 in turn.

The main constituents of color filter 52 are black matrix 54 for covering a portion of the TFT, gate wiring, and source wiring, which is not related to the display function, and color pixel portion 55 for transmitting light which passes through a pixel area (having the pixel electrode 35) relating to the color display function. The color pixel portion 55 is necessary for a color LCD, and is provided for each pixel. As for the total display screen, three kinds of pixel portions corresponding to three primary colors R (red), G (green), and B (blue) are arranged in a regular or random pattern in a manner such that the adjacent pixel portions have different colors and the three color portions are balanced.

In the cross-sectional structure shown in FIG. 1, oriented films provided at the liquid crystal side of TFT substrate 31 and at the liquid crystal side of the opposing substrate 32 are not shown, and polarizing plates provided at the outer side of TFT substrate 31 and at the outer side of the opposing substrate 32 are also not shown.

In the TFT substrate 31 provided in LCD 30 shown in FIG. 1, Cu layers 40a, 46b, and 48a are respectively coated with coating films 40b, 46b, and 48b, each functioning as a protective film. Therefore, even if an etching material having the oxidizing capability, used in a latter process for etching other layers, reaches the gate electrode 40, source electrode 46, and drain electrode 48, each electrode is not easily damaged. Therefore, it is possible to prevent each electrode from being detached from the base, and breaking of wiring can also be prevented and the etching material to be used is less limited.

Similarly, as Cu layers 40a, 46b, and 48a are respectively coated with coating films 40b, 46b, and 48b, even if a resist-detaching solvent used in the photolithography process reaches the gate electrode 40, source electrode 46, and drain electrode 48, each electrode is not easily corroded by the resist-detaching solvent.

In addition, Cu layers 40a, 46b, and 48a of the gate electrode 40, source electrode 46, and drain electrode 48 are respectively coated with coating films 40b, 46b, and 48b as described above; therefore, no oxide layer is formed (due to the water content) on the surface of each electrode before the etching, and thus each electrode is also not easily damaged by an etching material having no oxidizing capability, thereby preventing generation of breaking of wiring.

In addition, the gate electrode 40, source electrode 46, and drain electrode 48 respectively have coating films 40b, 46b, and 48b as described above; therefore, when the insulating film 41 or passivation film 49 is formed on each electrode by using the CVD method or the like, it is possible to prevent chemical reaction between Cu (included in electrodes 40, 46, and 48) and $SiH_4$ gas used for forming the insulating film and the like. Therefore, it is possible to prevent generation of needle-like protrusions on each Cu layer (caused by such a chemical reaction), and to prevent degradation of insulation resistance caused by such needle-like protrusions.

As described above, in the gate electrode 40, source electrode 46, and drain electrode 48, Cu layers 40a, 46b, and 48a are respectively coated with coating films 40b, 46b, and 48b, each functioning as a barrier layer. Therefore, even if Si atoms disperse from base 36, the atoms are blocked by coating film 40b and cannot enter the gate 40, thereby preventing an increase of resistance of gate electrode 40. Similarly, even if Cu atoms disperse from Cu layer 40a, the atoms are also blocked by coating film 40b and cannot enter the gate insulating film 41, thereby preventing degradation of withstand voltage caused by the dispersion of Cu atoms. Similarly, even if Cu atoms disperse from Cu layers 46a and 48a, the atoms are also blocked by coating film 46b and 48b and cannot enter the semiconductor active film 42, thereby preventing degradation of performance of the semiconductor active film 42 caused by the dispersion of Cu atoms.

Here, even though electrode 48 directly contacts the pixel electrode made of ITO, the electrode 48 is not oxidized by the oxygen in the ITO (it is oxidized if aluminium is used as the wiring material); therefore, the contact resistance with respect to ITO is low.

According to the TFT substrate 31 in the present embodiment, resistance to oxidation with respect to water or oxygen, and resistance to the etching material or resist-detaching solvent can be improved while keeping the effects of using Cu as wiring material. Therefore, adhesion with respect to the base can also be improved, and breakage of wiring and corrosion can be prevented. Additionally, several kinds of etching materials can be used; thus, the processes performed after the Cu wiring are formed are less limited. Furthermore, inter-dispersion of elements between adjacent films can be prevented. Accordingly, it is possible to provide a TFT substrate having desirable withstand voltage, and desirable performance of the semiconductor active film.

In LCD 30 having the above-explained TFT substrate 31 in the present embodiment, signal-voltage drop due to the wiring resistance and signal delay relating to wiring do not easily occur, and it is possible to easily provide a display suitable for a wide-area display using longer wiring, or for a fine display using thinner wiring. In addition, the wiring is not easily detached from the base, breakage of wiring and corrosion are prevented, and inter-dispersion of the elements between adjacent wiring and film is prevented in the TFT substrate 31; thus, an LCD having preferable performance can be provided.

Below, an embodiment of the method of manufacturing the TFT substrate according to the present invention will be explained. Here, the method of manufacturing the TFT substrate as shown in FIG. 1 will be explained.

Figure 4:
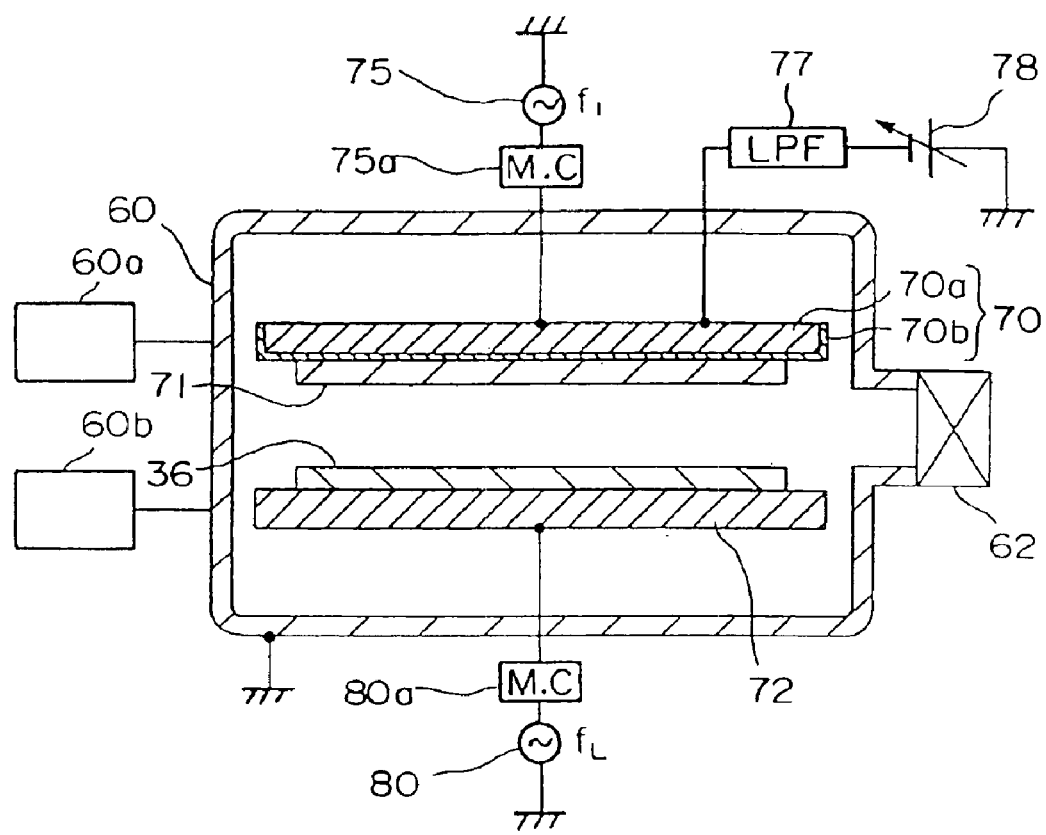
FIG. 4 is a diagram showing the structure of the film formation chamber of the thin-film formation apparatus preferably used for manufacturing the embodiment of the TFT substrate according to the present invention.
Figure 5:
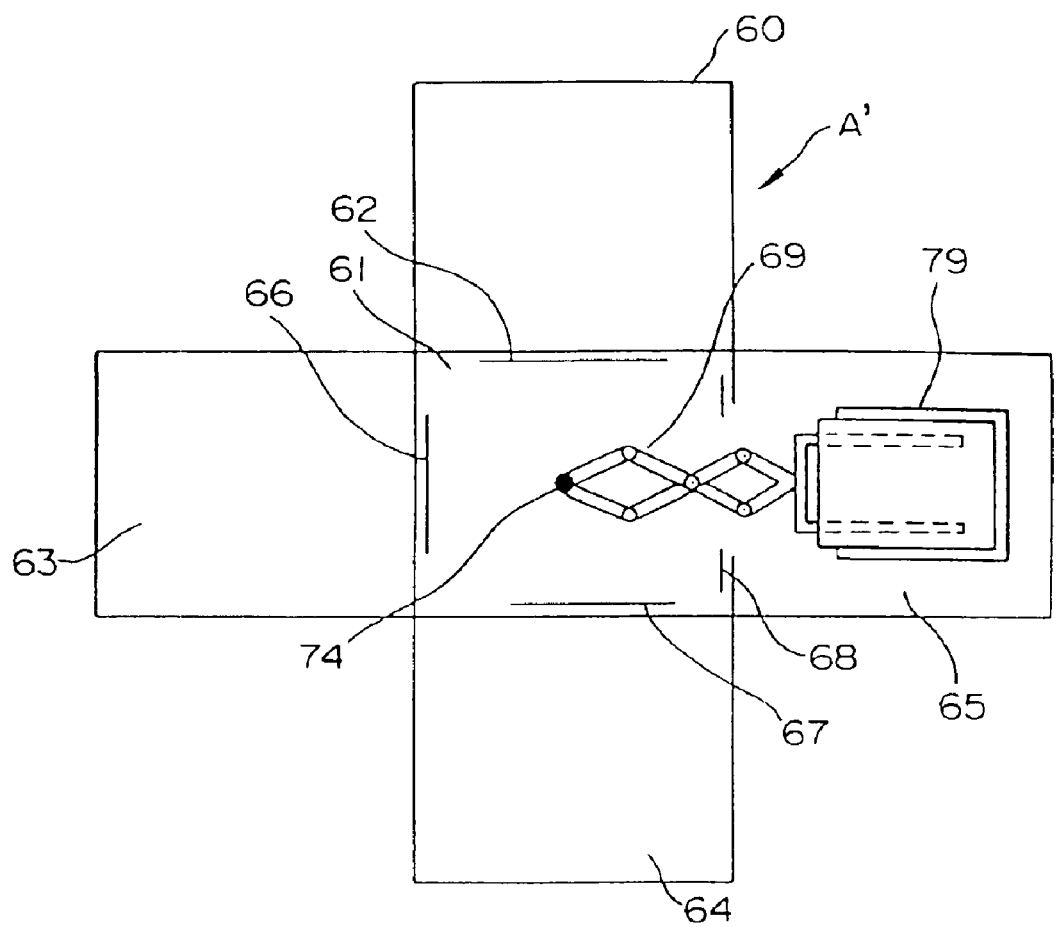
FIG. 5 is a plan view showing the general structure of the thin-film formation apparatus preferably used for manufacturing the embodiment of the TFT substrate according to the present invention.
Figure 6:
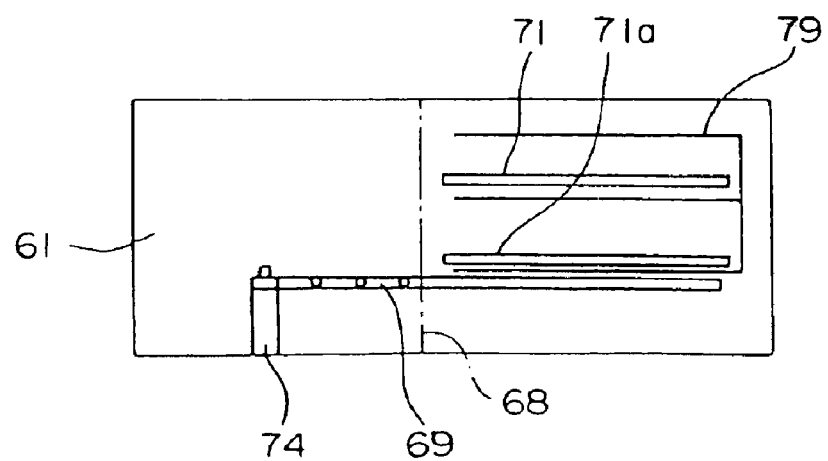
FIG. 6 is an enlarged side view showing a portion of the thin-film formation apparatus of FIG. 5.

FIG. 4 shows a film formation chamber suitably used for forming thin films for manufacturing the TFT substrate explained in the first embodiment. FIG. 5 is a plan view showing the general structure of the thin-film formation apparatus, and FIG. 6 is an enlarged side view showing a portion of the thin-film formation apparatus shown in FIG. 5.

FIG. 4 shows film formation chamber 60 which can be maintained in a decompressed state. This film formation chamber 60 is joined to (a side of) transfer chamber 61 via gate valve 62, as shown in FIG. 5.

In addition to the film formation chamber 60, the transfer chamber 61 is also surrounded by loader (or loading) chamber 63, unloader (or unloading) chamber 64, and stocker chamber 65, where these chambers are joined to the transfer chamber 61 via gate valves 66, 67, and 68. As explained above, thin-film formation apparatus A' consists of film formation chamber 60, transfer chamber 61, loader chamber 63, unloader chamber 64, and stocker chamber 65.

As shown in FIG. 4, the first electrode 70 is provided in the upper area of the above film formation chamber 60, and target 71 is detachably attached to the bottom face of the electrode 70, while the second electrode 72 is provided in the bottom area of the film formation chamber 60, and substrate 36, at least the surface of which is insulated, is detachably attached to the top face of the second electrode 72.

When gate electrode 40, source electrode 46, or drain electrode 48 is formed, one (metal) of titanium, molybdenum, chromium, and tantalum, or Cu is used as materials for forming target 71. When an a–Si: n$^+$ layer is formed, P-doped Si for forming an n-type a–Si: n$^+$ layer is used as a material for target 71.

A glass substrate may be preferably used as substrate 36, for forming a TFT substrate. In order to attach the target 71, a generally known target attaching mechanism such as an electrostatic chuck can be used.

The first electrode 70 consists of main portion 70a made of a conductive material, and protective layer 70b formed on the surface of the main portion 70a, where the protective layer 70b may be an oxide, nitride, or fluoride film.

The first AC (alternating current) power supply 75 is connected to the first electrode 70, and matching circuit 75a is inserted between the first electrode 70 and first AC power supply 75. The matching circuit 75a can cancel the reflected wave with respect to the high-frequency electric power.

In addition, DC (direct current) power supply 78 is also connected to the first electrode 70 via band-pass filter 77, such as a low-pass filter, for adjusting the impedance. The impedance of the circuit can be unlimitedly adjusted by using the band-pass filter 77, so as not to include a high-frequency wave in the output of the DC power supply 78.

In contrast, the second AC power supply 80 is connected to the second electrode 72, and matching circuit 80a (having functions similar to those of the above-explained matching circuit 75a) is inserted between the second electrode 72 and the second AC power supply 80.

The film formation chamber 60 also has an exhaust unit 60a for evacuating the chamber or discharging gas from the chamber, a reaction-gas supply mechanism 60b for supplying a reaction gas to the film formation chamber 60, and the like, but detailed structures of these structural elements are not shown in FIG. 4 in order to simplify the explanations.

In the transfer chamber 61; a link type transfer mechanism (magic hand) 69 is provided, and this transfer mechanism 69 can freely rotate with spindle 74 provided at the center of the transfer chamber 61. The target 71 can be pulled out of cassette 79 stored in the stocker chamber 65 by using the transfer mechanism 69, and can also be transferred to the film formation chamber 60 and further attached to the first electrode 70 in the film formation chamber 60.

A dummy target 71a is also stocked in the cassette 79, and this dummy target 71a can also be transferred to the film formation chamber 60.

The thin-film formation apparatus as shown in FIGS. 4 to 6 can form one or more films by using a single film formation chamber 60. For example, it is possible to successively form metallic and Cu films for forming the gate electrode 40; metallic and Cu films for forming gate insulating film 41, semiconductor active film 42, ohmic contact films 43 and 44, and source electrode; and metallic and Cu films for forming drain electrode 48; and passivation film 49.

That is, in the film formation chamber 60, it is possible to successively perform the CVD film-formation and the sputtering film-formation by selecting a suitable power supply, where the CVD method is applied to the formation of the gate insulating film, semiconductor active film, and passivation film 49, while the sputtering method is applied to the formation of metallic and Cu films for forming the ohmic contact films and gate electrode, and metallic and Cu films for forming the source electrode, and metallic and Cu films for forming the drain electrode.

In the film formation, after film formation chamber 60, transfer chamber 61, and stocker chamber 65 are decompressed, gate valves 62 and 68 are opened and glass substrate 36 is attached to the second electrode 72 by using the transfer mechanism 69. The gate valve 62 is then closed, and necessary thin films such as gate electrode 40 are formed on substrate 36 according to the following processes.

1-1 Process of Forming a Metallic Film for Forming the Gate Electrode

Figure 7A:
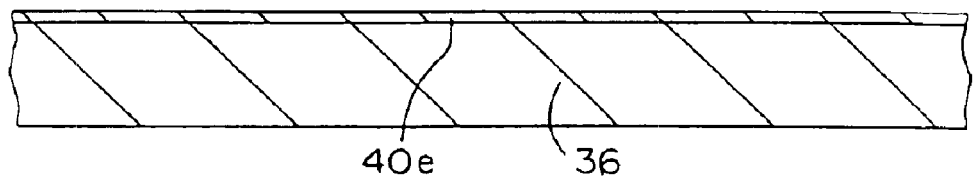
FIG. 7A is a view showing a process of the method of manufacturing the TFT substrate of the first embodiment according to the present invention.

An Ar gas atmosphere is generated in the film formation chamber 60, and target 71 made of a metal material selected from titanium, molybdenum, chromium, and tantalum is attached to the first electrode 70. The glass substrate 36 is attached to the second electrode 72. Under these conditions, high-frequency power having a frequency of approximately 13.6 MHz is supplied from the first AC power supply 75 to the first electrode 70. The sputtering process is then performed using a negative load having a voltage of –200 V (supplied from the DC power supply 78), so that a metallic film 40e having a thickness of approximately 50 nm is deposited on the substrate 36, as shown in FIG. 7A.

Here, a metallic oxide layer generated by reaction between metal elements of the metallic film 40e and remaining oxygen in the film formation chamber 60 may be formed on the metallic film 40e. Preferably, such a metallic oxide layer is removed by the plasma etching.

In this plasma etching, after an Ar gas atmosphere is generated in the film formation chamber 60, dummy target 71a is attached to the first electrode 70. In the next step, high-frequency power is supplied from the first AC power supply 75 to the first electrode 70 while the glass substrate 36 on which the metallic film 40e is formed is still attached to the second electrode 72. After that, plasma is generated by floating the negative electric potential, and high-frequency power is supplied to the second electrode 72 so as to apply AC power of approximately 200 W to substrate 36 for about 2 minutes.

Figure 7B:
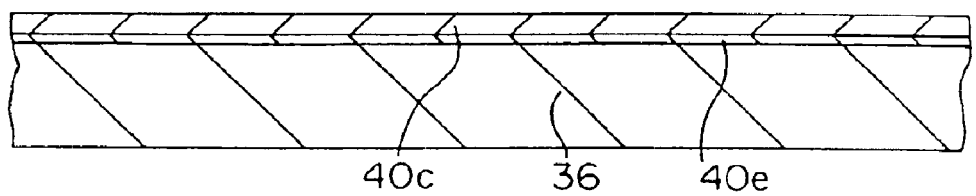
FIG. 7B is a view showing a process of the method of manufacturing the TFT substrate of the first embodiment according to the present invention.

1-2 Process of Forming a Cu Film for Forming the Gate Electrode, by Using Two-Frequency Excited Sputtering Method After an Ar gas atmosphere (i.e., non-oxide atmosphere) is generated in the film formation chamber 60, target 71 made of Cu is attached to the first electrode 70. A Cu layer is formed using the two-frequency excited sputtering process in which DC power is applied from the DC power supply 78 to the target 71 while the glass substrate 36 is still attached to the second electrode 72, and AC power is applied to the glass substrate 36 by operating the second AC power supply 80, so that a Cu film 40c having a thickness of approximately 150 nm is deposited on the metallic film 40e (formed on the substrate 36), as shown in FIG. 7B. In this process, the AC power applied to substrate 36 is approximately 0.1 to 5 W/cm$^2$. Accordingly, the diameter of Cu crystal grains as constituents of Cu film 40c can be sufficiently small; thus, the grain boundary, of Cu crystals is larger and the elements in the metallic film 40e are easily drawn into the Cu film 40c and these elements actively disperse.

1-3 Process of Patterning Metallic and Cu Films of the Gate Electrode

Figure 7C:
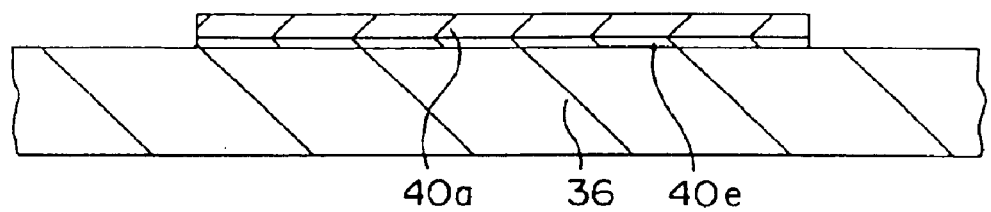
FIG. 7C is a view showing a process of the method of manufacturing the TFT substrate of the first embodiment according to the present invention.

The surface of the Cu film 40c is coated with a resist and pattern exposure is performed. After unnecessary portions of the Cu film 40c and metallic film 40e are removed by etching, the resist is removed, so that stacked (or multilayered) Cu layer (Cu wiring) 40a and metallic film 40e having a desired wiring width are formed as shown in FIG. 7C.

1-4 First Annealing Process of Substrate (Base)

Figure 7D:
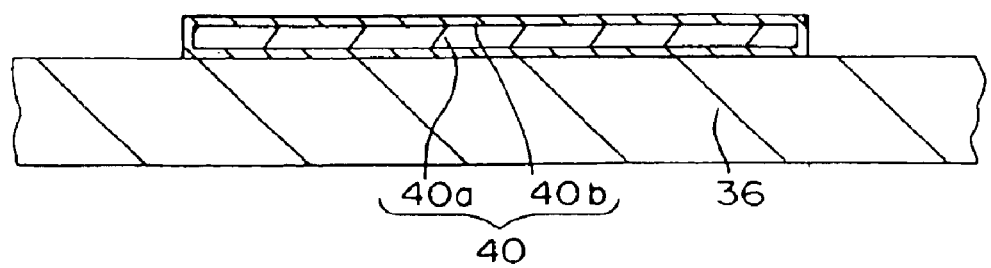
FIG. 7D is a view showing a process of the method of manufacturing the TFT substrate of the first embodiment according to the present invention.

The substrate 36 on which the stacked layers (of Cu layer 40a and metallic film 40e) are formed is annealing-processed in an Ar gas atmosphere, so as to disperse the metal elements, which were introduced from metallic film 40e to Cu layer 40a, towards the surface of the Cu layer 40a. Accordingly, gate electrode 40 having Cu layer 40a surrounded by metallic coating film 40b (made of a metal selected from titanium, molybdenum, chromium, and tantalum) is obtained as shown in FIG. 7D, where the thickness of the coating film 40b is approximately 5 to 20 nm.

The above annealing process is executed approximately for two hours at about 400° C.

If the atmosphere during the annealing process includes no oxygen, coating film 40b having 0 atom % of the content of the oxygen atoms can be obtained. In addition, the percentage content of the oxygen atoms in the coating film 40b can be gradually increased by gradually increasing the partial pressure of oxygen in the atmosphere in the annealing process.

Therefore, if metallic film 40e made of titanium is formed on substrate 36, coating film 40b made of titanium or titanium oxide is formed. More specifically, coating film 40b having the composition ratio of the number of titanium atoms to the number of oxygen atoms of "1 to 0" to "1 to 2" is formed.

If metallic film 40e made of molybdenum is formed, coating film 40b made of molybdenum or molybdenum oxide is formed. More specifically, coating film 40b having the composition ratio of the number of molybdenum atoms to the number of oxygen atoms of "1 to 0" to "1 to 3" is formed.

If metallic film 40e made of chromium is formed, coating film 40b made of chromium or chromium oxide is formed. More specifically, coating film 40b having the composition ratio of the number of chromium atoms to the number of oxygen atoms of "1 to 0" to "1 to 2" is formed.

If metallic film 40e made of tantalum is formed, coating film 40b made of tantalum or tantalum oxide is formed. More specifically, coating film 40b having the composition ratio of the number of tantalum atoms to the number of oxygen atoms of "1 to 0" to "1 to 2.5" is formed.

The thickness of the metallic film 40e made of titanium may be changed, and the annealing temperature may also be changed within 400 to 1200° C., and the annealing time may also be changed within 30 minutes to 1 hour. Accordingly, as shown in FIG. 2, it is possible to form coating film 40b having (i) titanium film 40f which surrounds the Cu layer 40a, and (ii) film 40g which is formed on the surface of the titanium film 40f and is made of a titanium oxide having the composition ratio of the number of titanium atoms to the number of oxygen atoms of "1 to 1" to "1 to 2". Similarly, as shown in FIG. 3, it is possible to form coating film 40b having (i) titanium film 40h provided at a portion of the circumferential area of Cu layer 40h, and (ii) film 40i which is provided at the remaining portion of the circumferential area of Cu layer 40a and is made of a titanium oxide having the composition ratio of the number of titanium atoms to the number of oxygen atoms of "1 to 1" to "1 to 2".

1-5 CVD Film Formation Process of Gate Insulating Film (Silicon Nitride Film) 41

Figure 8A:
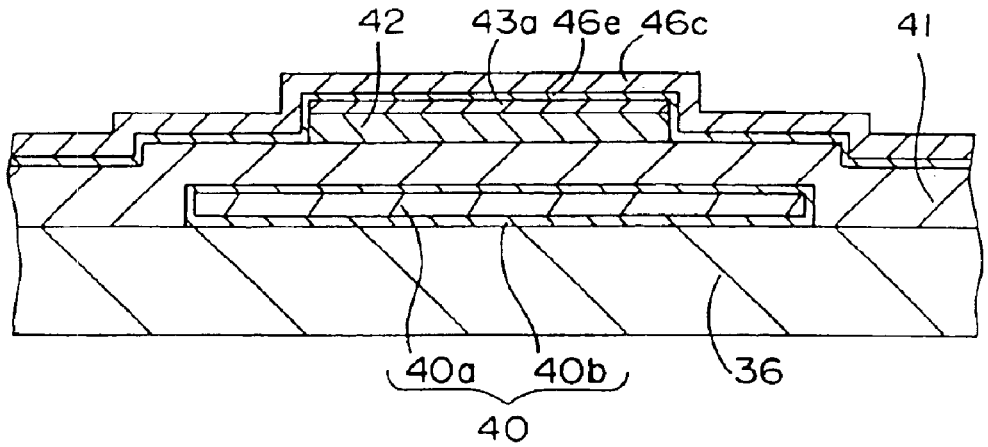
FIG. 8A is a view showing a process of the method of manufacturing the TFT substrate of the first embodiment according to the present invention.

A "SiH$_4$+NH$_3$+N$_2$" mixed gas atmosphere is generated in the film formation chamber 60, and dummy target 71a is still attached to the first electrode 70. Next, high-frequency power of 200 MHz is supplied from the first AC power supply 75 to the first electrode 70, and plasma is generated by floating a negative electric potential, so as to perform the CVD film formation in which a silicon nitride film is deposited on the substrate 36. Accordingly, gate insulating film 41 as shown in FIG. 8A is obtained.

In the above CVD film formation, the frequency of the supplied power is large so as not to sputter the dummy target 71a attached to the first electrode 70, and so as to apply a small ion energy to the first electrode 70. Additionally, high-frequency power is also supplied to the second electrode 72 so as to control the ion energy applied on the substrate 36.

1-6 CVD Film Formation Process of Semiconductor Active Film (a-Si Layer) 42

After a "SiH$_4$+H$_2$" mixed gas atmosphere is generated in the film formation chamber 60, dummy target 71a is attached to the first electrode 70. Next, high-frequency power of approximately 200 MHz is supplied from the first AC power supply 75 to the first electrode 70. High-frequency power is also supplied from the second AC power supply 80 to the second electrode 72, so as to control the ion energy applied to the glass substrate 36 and form an a-Si layer. Accordingly, the semiconductor active film 42 is formed.

1-7 Sputtering Process of Forming Ohmic Contact Film (a-Si: n$^+$ Layer) 43a

After an Ar gas atmosphere is generated in the film formation chamber 60, target 71 made of P-doped Si (used for forming an a-Si: n$^+$ layer) is attached to the first electrode 70. High-frequency power of approximately 13.6 MHz is supplied from the first AC power supply 75 to the first electrode 70. The sputtering is performed by using a negative electric potential of −200 V supplied from the DC power supply 78, so that ohmic contact film 43a is formed on the semiconductor active film 42.

1–8 Patterning Process of the Semiconductor Active Film and Ohmic Contact Film

The surface of the ohmic contact film 43a is coated with a resist and pattern exposure is performed. After unnecessary portions are removed by etching, the resist is removed, so that island-shape semiconductor active film 42 and ohmic contact film 43a, smaller than the gate electrode 40, are obtained as shown in FIG. 8A. The position of the semiconductor active film 42 and ohmic contact film 43a is the opposite side of the gate electrode 40 with respect to the gate insulating film 41.

1-9 Process of Forming a Metallic Film for the Source Electrode and Drain Electrode According to a process similar to that for forming the metallic film for the gate electrode, metallic film 46e having a thickness of approximately 50 nm is formed so as to cover the upper face and both side faces of the ohmic contact film 43a, both side faces of the semiconductor active film 42 (under the ohmic contact film 43a), and a portion of the upper face of the gate insulating film 41 contacting the semiconductor active film 42 (see FIG. 8A). Here, a metallic oxide layer may be formed on the metallic film 46e. Preferably, such a metallic oxide layer is removed using a method similar to the plasma etching method applied to metallic film 40e.

1-10 Two-Frequency Excited Sputtering Film-Formation Process of Cu Film for Source and Drain Electrodes According to a process similar to the two-frequency excited sputtering film-formation process of the above-explained Cu film for the gate electrode, Cu film 46c having a thickness of approximately 150 nm is formed on the metallic film 46e (see FIG. 8A). Accordingly, elements included in the metallic film 46e are incorporated in the Cu film 46c.

Figure 8B:
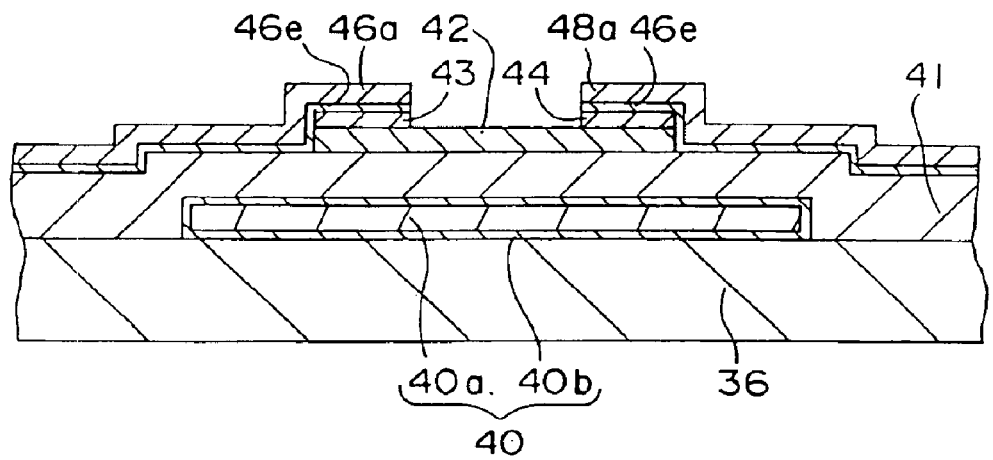
FIG. 8B is a view showing a process of the method of manufacturing the TFT substrate of the first embodiment according to the present invention.

1-11 Patterning Process of Metallic and Cu Films for Source and Drain Electrodes, Semiconductor Active Film, and Ohmic Contact Film The portion on a center area of the semiconductor active film 42 is removed by etching, that is, the relevant portion of the ohmic contact film 43a, metallic film 46e, and Cu film 46c are removed. Accordingly, as shown in FIG. 8B, a pair of separate ohmic contact films 43 and 44, and metallic film 46e and Cu layer 46a for forming the source electrode 46 and metallic film 46e and Cu layer 48a for forming the drain electrode 48 are formed at either end-side of the semiconductor active film 42.

1-12 Second Annealing Process of the Substrate

Figure 8C:
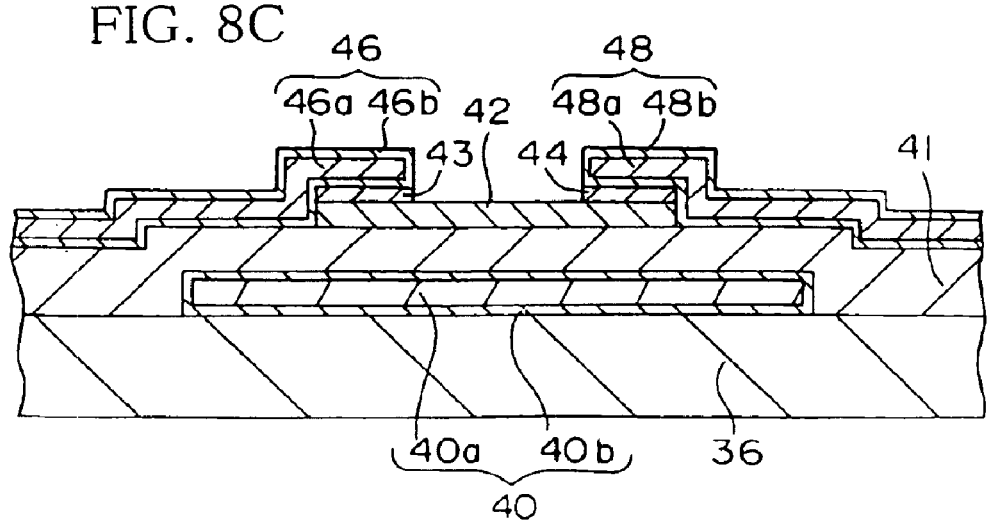
FIG. 8C is a view showing a process of the method of manufacturing the TFT substrate of the first embodiment according to the present invention.

The substrate 36 on which the metallic film 46e and Cu layer 46a for forming the source electrode 46 and metallic film 46e and Cu layer 48a for forming the drain electrode 48 are formed is annealing-processed according to a process similar to the above-explained first annealing process of the substrate. Therefore, the metal elements of the metallic film 46e, incorporated in the Cu layers 46a and 48a, are dispersed towards the surface of the Cu layers 46a and 48a, so that as shown in FIG. 8C, source electrode 46 and drain electrode 48 having Cu layers 46a and 48a surrounded by coating films 46b and 48b are obtained, where each coating film is made of a metal selected from titanium, molybdenum, chromium, and tantalum. Similar to the coating film 40b of the gate electrode 40, the coating films 46b and 48b may include oxygen according to the above-described composition ratio.

In addition, similar to the formation of the coating film 40b of the gate electrode 40, the thickness of metallic film 46e or annealing conditions may be changed. Accordingly, it is possible to form coating films 46b and 48b, each having (i) a titanium film which surrounds the Cu layer, and (ii) a film which is formed on the surface of the titanium film and is made of a titanium oxide having the composition ratio of the number of titanium atoms to the number of oxygen atoms of "1 to 1" to "1 to 2". Similarly, it is possible to form coating films 46b and 48b, each having (i) a titanium film provided at a portion of the circumferential area of the Cu layer, and (ii) a film which is provided at the remaining portion of the circumferential area of the Cu layer and is made of a titanium oxide having the composition ratio of the number of titanium atoms to the number of oxygen atoms of "1 to 1" to "1 to 2".

1-13 CVD Film Formation Process of Passivation Film 49

According to a process similar to the CVD film formation process of the gate insulating film 41, passivation film 49 made of silicon nitride is formed so as to cover the semiconductor active film 42, source electrode 46, and drain electrode 48.

1-14 Process of Forming Pixel Electrode

The passivation film 49 is etched by using a dry etching method, or by using dry and wet etching methods together, so as to form contact hole 50. After that, an ITO layer is formed on the passivation film 49, and pixel electrode 35 is formed by patterning. In addition, as shown in FIG. 1, connection conductor 51 is formed on the bottom and inner (wall) faces of the contact hole 50 and a portion of the upper face of the passivation film 49. The drain electrode 48 and pixel electrode 35 are connected via this connection conductor 51, so that the TFT substrate 31 as shown in FIG. 1 is obtained.

If substrate 36 on which $SiN_x$ film 36a is formed is used, then before the metallic film 40e is formed on the substrate 36, an $SiN_x$ film is formed according to a process similar to the above-explained CVD film formation process of the gate insulating film 41.

The source wiring is not shown in the drawings; however, the wiring may also be formed when the source electrode 46 is formed on the gate insulating film 41 and the following annealing and etching processes are performed.

As the above-explained method of manufacturing the TFT substrate 31 includes the two-frequency excited sputtering process of forming a Cu film on the metallic film on the substrate 36, the pattering process of the Cu film, and the annealing process of the base, it is possible to easily form gate electrode 40, source electrode 46, and drain electrode 48 on substrate 36, by which (i) oxidation resistance against water or oxygen, (ii) corrosion resistance against the etching material, resist-detaching solvent, and the like, and (iii) adhesion to the base can be improved, and inter-dispersion of the elements between adjacent films can be prevented. Therefore, the manufacturing processes are not complicated.

Also according to the present method of manufacturing the TFT substrate (of the present invention), the gate electrode 40, source electrode 46, and drain electrode 48 having the above characteristics can be formed on the substrate 36 at a low temperature; thus, the present method can be applied to a case using a glass substrate (as the base) which cannot tolerate heating at 600% or more.

In the above-explained method of manufacturing the TFT substrate, the metallic film functioning as the coating film for the electrode is formed in a chamber including a plasma apparatus, as shown in FIG. 4. However, the above metallic film may be formed by using an ordinary sputtering apparatus.

Second Embodiment

Figure 9:
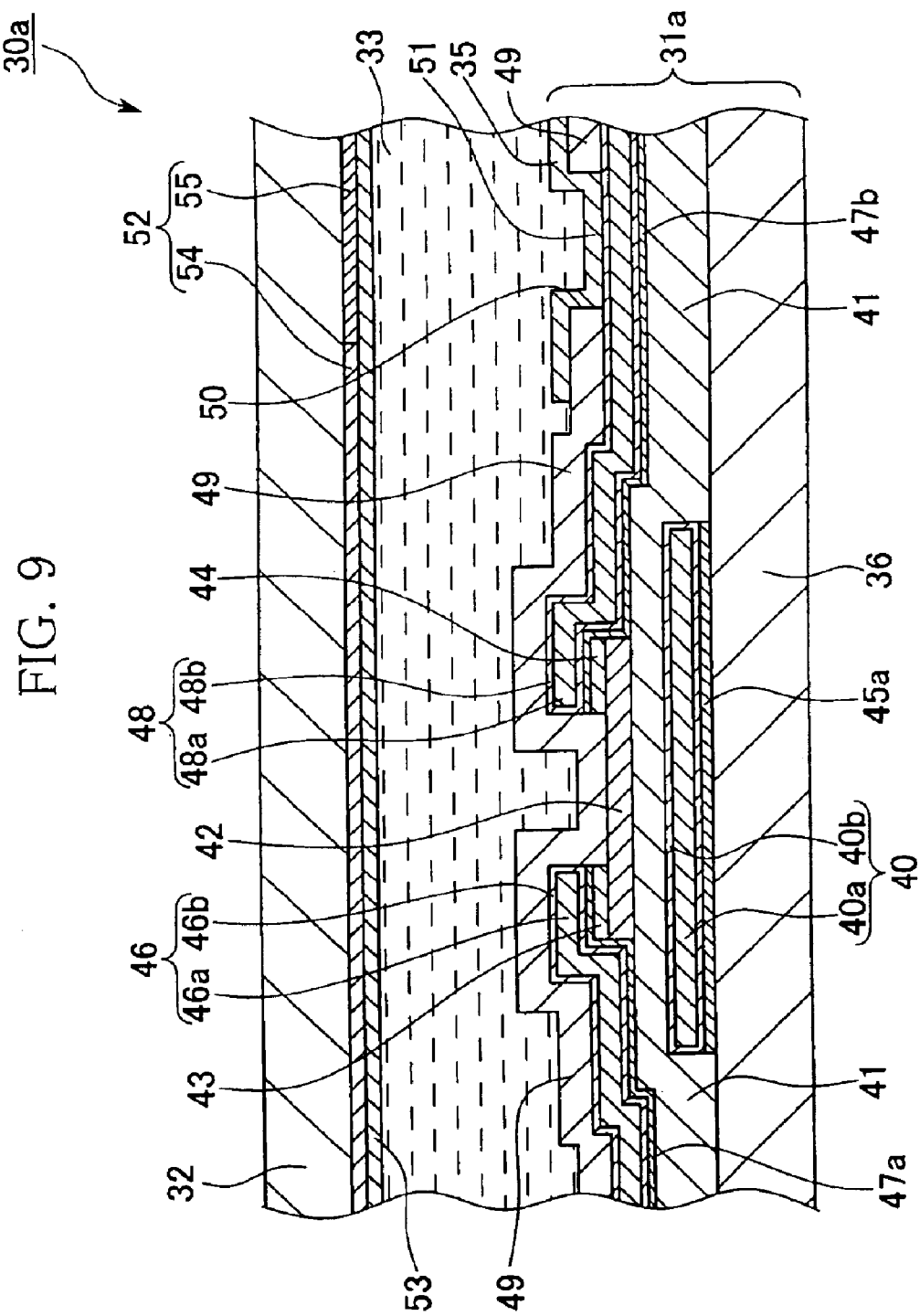
FIG. 9 is a view showing the cross-sectional structure of the second embodiment of the LCD and the TFT substrate according to the present invention.

FIG. 9 shows a distinctive portion of the second embodiment of the LCD according to the present invention. The difference of the LCD 30a of this second embodiment from the LCD 30 (as shown in FIG. 1) of the first embodiment is to comprise a bottom-gate type TFT substrate 31a as shown in FIG. 9.

The difference of the TFT substrate 31a from the TFT substrate 31 as shown in FIG. 1 is that (i) TiN layer 45a is provided on a face of the gate electrode 40, the face being positioned at the glass substrate 36 side, (ii) TiN layer 47a is provided on a face of the source electrode 46, the face being positioned at the ohmic contact film 43 side, and (iii) TiN layer 47b is provided on a face of the drain electrode 48, the face being positioned at the ohmic contact film 44 side. The source electrode 46 is electrically connected to the ohmic contact film 43 and semiconductor active film 42 via TiN layer 47a, while the drain electrode 48 is electrically connected to the ohmic contact film 44 and semiconductor active film 42 via TiN layer 47b.

The TFT substrate 31a of the second embodiment having the above structure has functions and effects similar to those of the TFT substrate 31 of the first embodiment. In addition, the TFT substrate of the second embodiment has TiN layers 45a, 47a, and 47b between the substrate 36 and the electrodes 40, 46, and 48; thus, even when elements of the substrate 36 or gate insulating film 41, positioned under each electrode, disperse, the relevant atoms are blocked by TiN layers 45a, 47a, and 47b and cannot disperse into electrodes 40, 46, and 48. Therefore, it is possible to prevent an increase of the resistance of wiring caused by the element dispersion from the base 36 or adjacent films. Also according to the TiN layers 45a, 47a, and 47b, adhesion of the electrodes 40, 46, and 48 can be improved.

The TFT substrate 31a can also be formed by using the thin-film formation apparatus as shown in FIGS. 4 to 6.

Below, the method of manufacturing the TFT substrate 31a of the second embodiment will be explained in detail.

2-1 Process of Forming TiN Film for the Gate Electrode

Figure 10A:
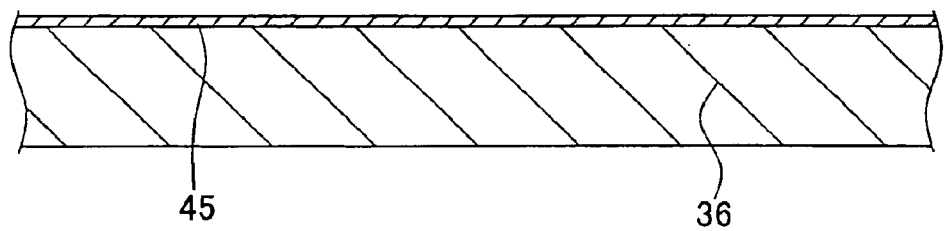
FIG. 10A is a view showing a process of the method of manufacturing the TFT substrate of the second embodiment according to the present invention.

After a gas (including N) atmosphere is generated in the film formation chamber 60, target 71 made of titanium is attached to the first electrode 70, and glass substrate 36 is attached to the second electrode 72. After that, high-frequency power of approximately 13.6 MHz is supplied from the first AC power supply 75 to the first electrode 70, and sputtering using a negative electric potential of −200 V, supplied from the DC power source 78, is performed, so that TiN film 45 having a thickness of approximately 50 nm is formed on the substrate 36, as shown in FIG. 10A. The N-included gas atmosphere may be a mixed gas of a gas such as $N_2$, $N_2O$, or $NO_2$, and an Ar gas.

2-2 Process of Forming the Metallic Film for the Gate Electrode

After the atmosphere of the film formation chamber 60 is switched from the above N-included gas atmosphere to an Ar gas atmosphere, target 71 to be attached to the first electrode 70 is also changed to one made of a metal selected from titanium, molybdenum, chromium, and tantalum. Then, according to a process similar to the process for forming the metallic film for the gate electrode, explained in the above section 1-1, metallic film 40e having a thickness of approximately 50 nm is formed on the TiN film 45 on the substrate 36, as shown in FIG. 10B.

Figure 10B:
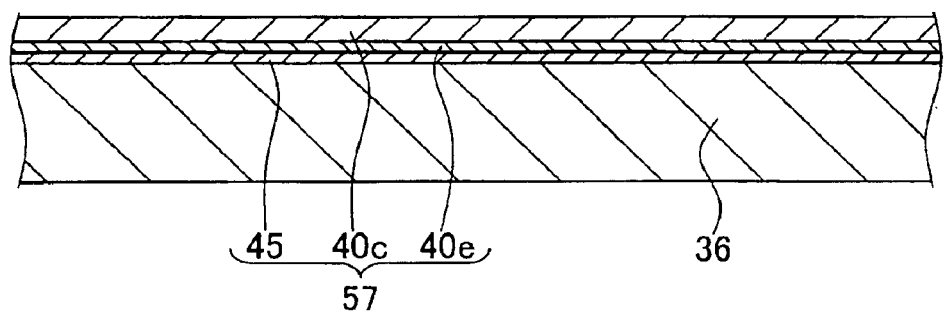
FIG. 10B is a view showing a process of the method of manufacturing the TFT substrate of the second embodiment according to the present invention.

2-3 Two-Frequency Excited Sputtering Process for Forming the Cu Film for the Gate Electrode According to a process similar to the two-frequency excited sputtering film formation process explained in the above section 1-2, Cu film 40c having a thickness of approximately 150 nm is formed on the metallic film 40e, as shown in FIG. 10B, so that multi-layered film 57 consisting of TiN film 45, metallic film 40e, and Cu film 40c is formed. Accordingly, the elements in the metallic film 40e are incorporated into the Cu film 40c.

Figure 10C:
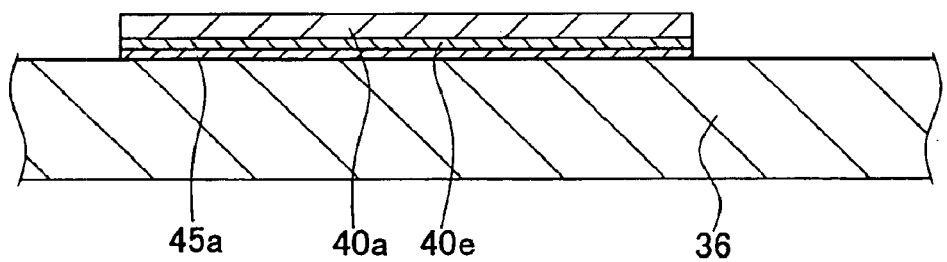
FIG. 10C is a view showing a process of the method of manufacturing the TFT substrate of the second embodiment according to the present invention.
Figure 10D:
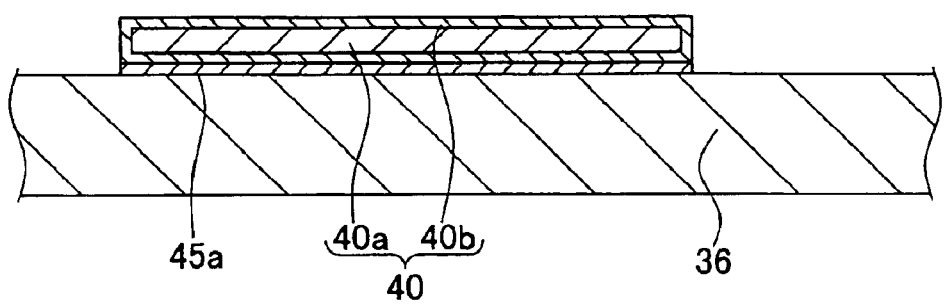
FIG. 10D is a view showing a process of the method of manufacturing the TFT substrate of the second embodiment according to the present invention.

2-4 Patterning Process of the TiN Film, Metallic Film, and Cu Film for the Gate Electrode According to a process similar to the patterning process explained in the above section 1-3, the patterning of multi-layered film 57 is performed. Accordingly, a multilayered film consisting of TiN film 45a, metallic film 40e, and Cu film 40a, having a desired width, is formed as shown in FIG. 10C.

2-5 First Annealing Process of the Substrate (Base)

According to a process similar to the first annealing process explained in the above section 1-4, the substrate 36 on which the TiN film 45a, metallic film 40e, and Cu film 40a are formed is annealing-processed, so as to disperse the metal elements of the metallic film 40e, which were incorporated in the Cu film 40a, towards the surface of the Cu film 40a. Therefore, gate electrode 40 having the Cu layer 40a surrounded by coating film 40b made of a metal selected from titanium, molybdenum, chromium, and tantalum is obtained, as shown in FIG. 1D.

In this process, the TiN film 45a is still put between the gate electrode 40 and substrate 36.

2-6 CVD Film Formation Process of Gate Insulating Film (Silicon Nitride Film) 41

Figure 11A:
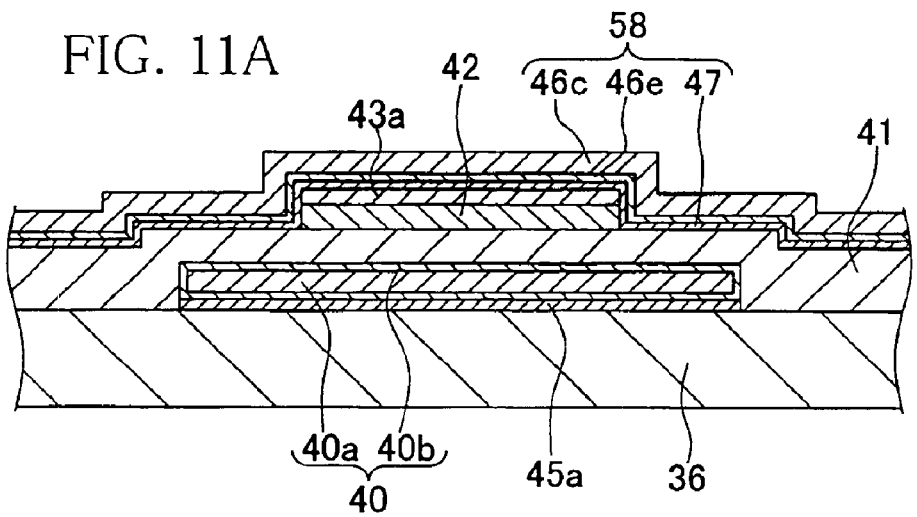
FIG. 11A is a view showing a process of the method of manufacturing the TFT substrate of the second embodiment according to the present invention.

According to a process similar to the CVD film formation process of the gate insulating film explained in the above section 1-5, a silicon nitride film is deposited on the substrate 36 by the CVD film formation method, so that the gate insulating film 41 as shown in FIG. 11A is formed.

2-7 CVD Film Formation Process of Semiconductor Active Film (a-Si Layer) 42

According to a process similar to the CVD film formation process of the semiconductor active film explained in the above section 1-6, an a-Si layer is deposited on the gate insulating film 41, so that the semiconductor active film 42 is formed.

2-8 Sputtering Process of Forming Ohmic Contact Film (a-Si: n$^+$ Layer) 43a

According to a process similar to the sputtering process of forming ohmic contact film explained in the above section 1-7, ohmic contact film 43a is formed on the semiconductor active film 42.

2-9 Patterning Process of the Semiconductor Active Film and Ohmic Contact Film

According to a process similar to the patterning process explained in the above section 1-8, patterning of the semiconductor active film 42 and ohmic contact film 43a is performed, so that island-shape semiconductor active film 42 and ohmic contact film 43a, smaller than the gate electrode 40, are obtained as shown in FIG. 11A.

2-10 Process of Forming the TiN Film for the Source and Drain Electrodes

After an N-included gas atmosphere as explained in the above section 2-1 is generated in the film formation chamber 60, target 71 made of titanium is attached to the first electrode 70, and glass substrate 36 is still attached to the second electrode 72. Under these conditions, high-frequency power of approximately 13.6 MHz is supplied from the first AC power supply 75 to the first electrode 70, and sputtering using a negative electric potential of −200 V, supplied from the DC power source 78, is performed, so that TiN film 47 having a thickness of approximately 50 nm is formed as shown in FIG. 11A, in a manner such that the TiN film covers the upper face and both side faces of the ohmic contact film 43a, both side faces of the semiconductor active film 42 under the ohmic contact film, and a portion of the upper face of the gate insulating film 41 contacting the semiconductor active film.

2-11 Process of Forming the Metallic Film for the Source and Drain Electrodes

According to a process similar to the above-explained process of forming the metallic film for the gate electrode, metallic film 46e having a thickness of approximately 50 nm is formed on the TiN film 47, as shown in FIG. 11A.

2-12 Two-Frequency Excited Sputtering Process for Forming the Cu Film for the Source and Drain Electrodes According to a process similar to the above-explained two-frequency excited sputtering film formation process applied to the Cu film of the gate electrode, Cu film 46c having a thickness of approximately 150 nm is formed on the metallic film 46e, as shown in FIG. 11A, so that multi-layered film 58 consisting of TiN film 47, metallic film 46e, and Cu film 46c is formed. Accordingly, the elements in the metallic film 46e are incorporated into the Cu film 46c.

Figure 11B:
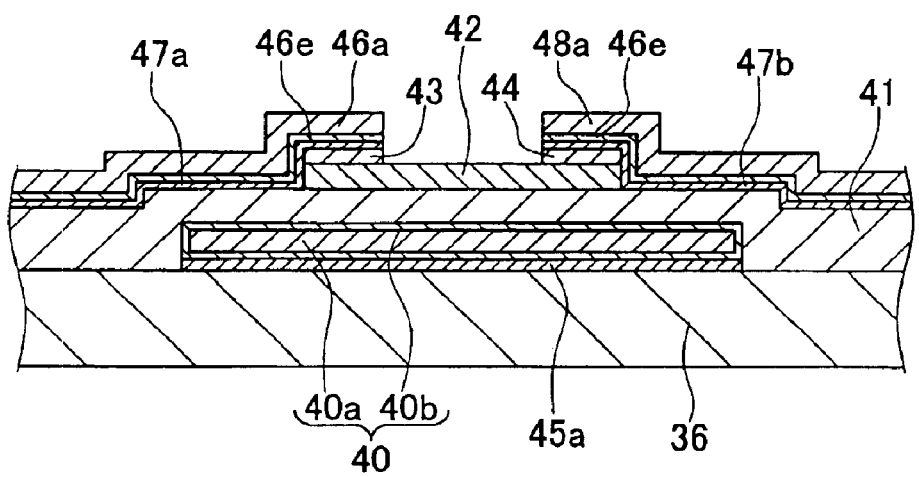
FIG. 11B is a view showing a process of the method of manufacturing the TFT substrate of the second embodiment according to the present invention.

2-13 Patterning Process of TiN, Metallic, and Cu Films for Source and Drain Electrodes, and the Semiconductor Active Film and Ohmic Contact Film The portion on a center area of the semiconductor active film 42 is removed by etching, that is, the relevant portion of the ohmic contact film 43a, TiN film 47, metallic film 46e, and Cu film 46c are removed. Accordingly, as shown in FIG. 11B, a pair of separate ohmic contact films 43 and 44, and (i) TiN film 47a, metallic film 46e, and Cu layer 46a for forming the source electrode 46 and (ii) TiN film 47b, metallic film, 46e and Cu layer 48a for forming the drain electrode 48 are formed at either end-side of the semiconductor active film 42.

2-14 Second Annealing Process of the Substrate

Figure 11C:
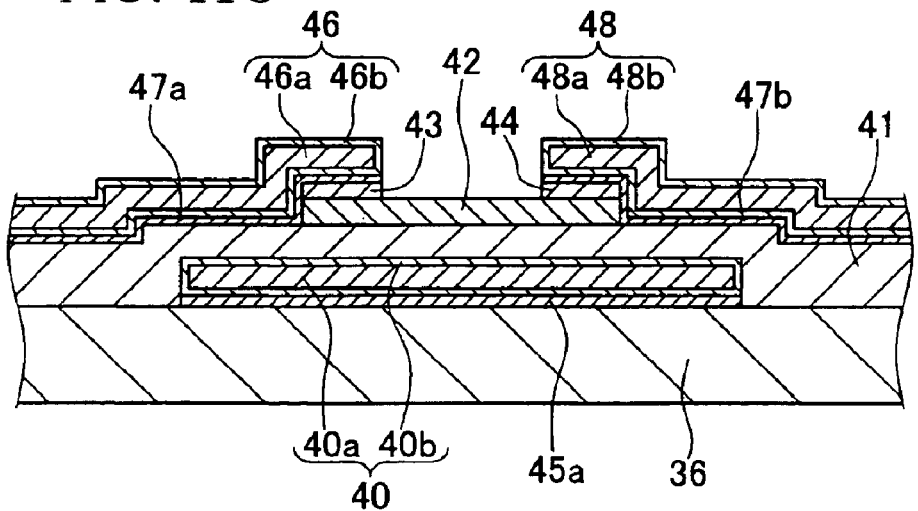
FIG. 11C is a view showing a process of the method of manufacturing the TFT substrate of the second embodiment according to the present invention.

According to a process similar to the first annealing process previously performed, the substrate 36, on which (i) TiN film 47a, metallic film 46e, and Cu layer 46a for forming the source electrode 46 and (ii) TiN film 47b, metallic film 46e, and Cu layer 48a for forming the drain electrode 48 are formed, is annealing-processed. Therefore, the metal elements of the metallic film 46e, incorporated in the Cu layers 46a and 48a, are dispersed towards the surface of the Cu layers 46a and 48a, so that as shown in FIG. 11C, source electrode 46 and drain electrode 48 having Cu layers 46a and surrounded by coating films 46b and 48b are obtained, where each coating film is made of a metal selected from titanium, molybdenum, chromium, and tantalum.

2-15 CVD Film Formation Process of Passivation Film 49

According to a process similar to the CVD film formation process of the gate insulating film 41, passivation film 49 made of a silicon nitride film is formed so as to cover the semiconductor active film 42, source electrode 46, and drain electrode 48.

2-16 Process of Forming Pixel Electrode

The passivation film 49 is etched by using a dry etching method, or by using dry and wet etching methods together, so as to form contact hole 50. After that, an ITO layer is formed on the passivation film 49, and pixel electrode 35 is formed by patterning. In addition, as shown in FIG. 9, connection conductor 51 is formed on the bottom and inner (wall) faces of the contact hole 50, and a portion of the upper face of the passivation film 49. The drain electrode 48 and pixel electrode 35 are connected via this connection conductor 51, so that the TFT substrate 31a as shown in FIG. 9 is obtained.

According to the above-explained method of manufacturing the TFT substrate, the TFT substrate 31a having the structure as shown in FIG. 9 can be manufactured.

In the above manufacturing method, almost all of the metal elements such as titanium as constituents of the metallic films 40e and 46e (between the substrate 36 and each Cu layer) can be dispersed towards the surfaces of the Cu layers 40a, 46a, and 48a by suitably determining each thickness of the metallic films 40e and 46e and by setting the annealing temperature for annealing the substrate 36 at 500° C. or more.

Figure 12:
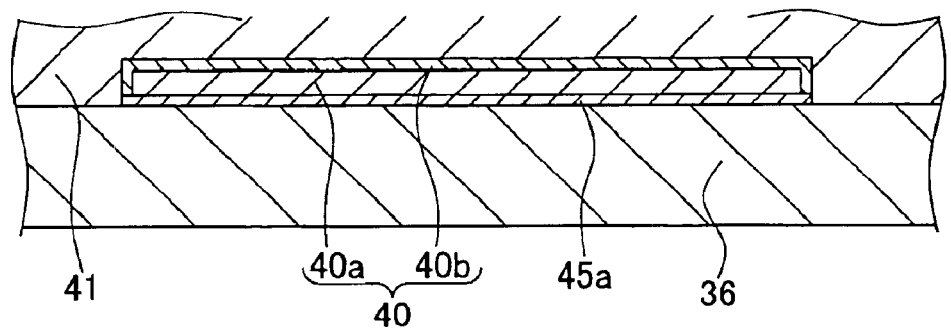
FIG. 12 is an enlarged cross-sectional view showing another example of the gate electrode provided in the TFT substrate in FIG. 9.
Figure 13:
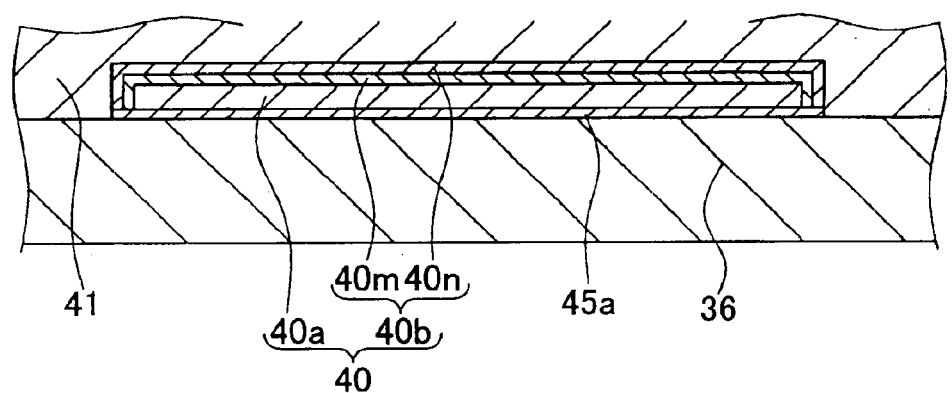
FIG. 13 is an enlarged cross-sectional view showing another example of the gate electrode provided in the TFT substrate in FIG. 9.

Accordingly, as shown in FIG. 12, it is possible to obtain gate electrode 40 having Cu layer 40a and coating film 40b which is formed on the surface of the Cu layer 40a and has composition ratio of the number of titanium atoms to the number of oxygen atoms of "1 to 0" to "1 to 2". Similarly, as shown in FIG. 13, it is possible to obtain gate electrode 40 having Cu layer 40a, titanium film 40m formed on the Cu layer 40a, and film 40n which is formed on the surface of the titanium film 40m and has composition ratio of the number of titanium atoms to the number of oxygen atoms of "1 to 1" to "1 to 2".

As for the source electrode 46 and drain electrode 48, it is also possible to obtain the structure (i) having a Cu layer and a coating film which is formed on the surface of the Cu layer and has composition ratio of the number of titanium atoms to the number of oxygen atoms of "1 to 0" to "1 to 2", or (ii) having a Cu layer, a titanium film formed on the Cu layer, and a film which is formed on the surface of the titanium film and has composition ratio of the number of titanium atoms to the number of oxygen atoms of "1 to 1" to "1 to 2".

The obtained electrodes 40, 46, and 48 do not have coating films 40b, 46b, and 48b at the lower-face sides of corresponding Cu layers 40a, 46a, and 48a; however, TiN layers 45a, 47a, and 47b are provided between the substrate 36 and electrodes 40, 46, and 48. Therefore, even when elements disperse from the substrate 36, gate insulating film 41, and the like, which are adjacent films under each electrode, the elements are blocked by these TiN layers 45a, 47a, and 47b and cannot disperse towards electrodes 40, 46, and 48. Therefore, it is possible to prevent an increase of the resistance of the wiring caused by the element dispersion from the substrate 36 and relevant adjacent films.

Third Embodiment

Figure 14:
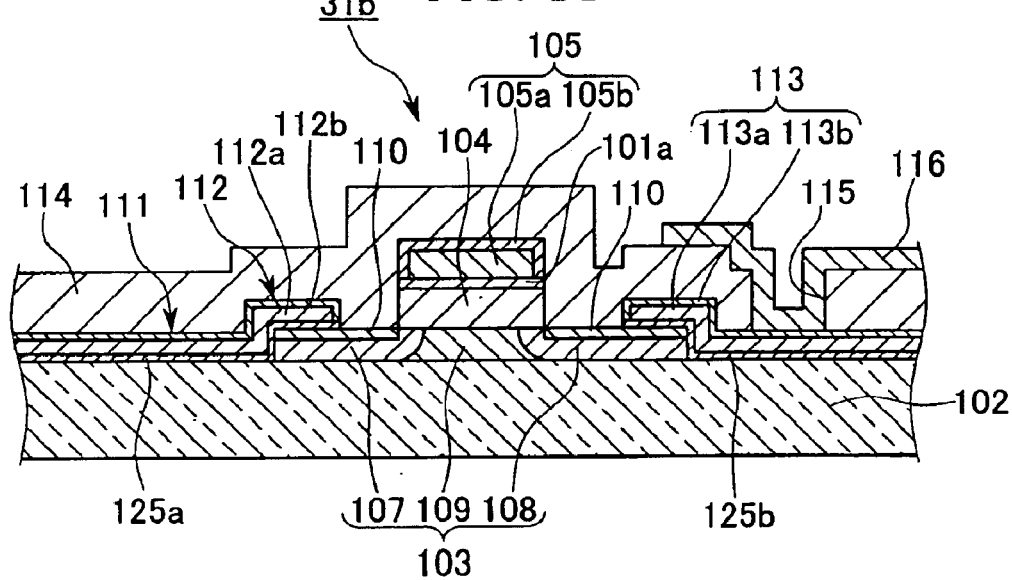
FIG. 14 is a view showing the cross-sectional structure of the third embodiment of the TFT substrate according to the present invention.

Below, the third embodiment of the TFT substrate according to the present invention will be explained with reference to FIG. 14.

The TFT substrate 31b of the third embodiment has a top-gate type TFT. For example, as shown in FIG. 14, a semiconductor layer 103 formed by using a polycrystalline silicon is deposited on transparent substrate 102 such as a glass substrate. A gate insulating film 104 made of $SiN_x$ or the like is formed on the center of semiconductor layer 103, and gate electrode 105 is formed on the gate insulating film 104 via TiN layer 101a. This gate electrode 105 has Cu layer 105a and coating film 105b which is formed on the Cu layer 105a and is made of the same material as that of the coating film 40b in the second embodiment. Here, the gate electrode 105 is integrally formed with a gate wiring not shown.

In the semiconductor layer 103, source area 107 and drain area 108 are formed, each consisting of an n⁻ semiconductor layer doped with n-type impurities such as $P^+$ or $As^+$ at a low concentration of $10^{16}$ atm/cm$^3$ or less. The area between the source area 107 and drain area 108 functions as channel (portion) 109. In addition, the n⁻ semiconductor layers serving as the source area 107 and drain area 108 extend towards areas under left and right end-portions of the gate insulating film 104.

In addition, silicide films 110 such as a tungsten silicide or molybdenum silicide are respectively formed on the surface of the source area 107 and drain area 108, where source wiring 111 and source electrode 112 are formed on one suicide film 110 via TiN layer 125*a*, while drain electrode 113 is formed on the other silicide film 110 via TiN layer 125*b*. The source wiring 111 and source electrode 112 have a structure comprising Cu layer 112*a* and coating film 112*b* which is formed on the surface of the Cu layer 112*a* and is made of a material similar to that of the coating film 46*b* of the second embodiment. The drain electrode 113 has a structure comprising Cu layer 113*a* and coating film 113*b* which is formed on the surface of the Cu layer 113*a* and is made of a material similar to that of the coating film 48*b* of the second embodiment.

The passivation film 114 covers the total face, and contact hole 115 is formed through the passivation film 114, which reaches the drain electrode 113. The drain electrode 113 and pixel electrode 116 (which is made of ITO) are connected via the contact hole 115.

In addition, the following arrangement (not shown) is also provided, that is, similar to the above contact hole 115, other holes are also provided in the passivation film 114 at (i) the gate terminal provided at the end of the gate wiring covered by the passivation film, and (ii) the source terminal provided at the end of the source wiring also covered by the passivation film. In each hole, a pad made of ITO is provided so as to be connect with the gate wiring or the source wiring.

In the TFT substrate 31*b* of the third embodiment, coating films 105*b*, 112*b*, and 113*b* are respectively provided on the surfaces of the Cu layers 105*a*, 112*a*, and 113*a*, each functioning as an electrode or wiring; thus, oxidation resistance against water or oxygen, and corrosion resistance against the etching material, resist-detaching solvent, and the like, can be improved. In addition, TiN layers 101*a*, 125*a*, and 125*b* are provided between the substrate 102 and (i) gate electrode 105, (ii) source wiring 111 and source electrode 112, and (iii) drain electrode 113; thus, even when elements disperse from the substrate (base) 102 or gate insulating film 104 (i.e., the adjacent film under each electrode and wiring), the relevant atoms are blocked by the TiN layers 101*a*, 125*a*, and 125*b*. Therefore, it is possible to prevent an increase of the resistance of the wiring caused by the element dispersion from substrate 102, gate insulating film 104, and the like. Furthermore, adhesion of the (i) gate electrode 105, (ii) source wiring 111 and source electrode 112, and (iii) drain electrode 113 can be improved according to the presence of the TiN layers 101*a*, 125*a*, and 125*b*.

SPECIFIC EXAMPLE 1

A titanium film having a thickness of 50 nm was formed on a glass substrate by using the thin-film formation apparatus as shown in FIGS. 4 to 6. In the processes, after an Ar gas atmosphere was generated in the film formation chamber 60, target 71 made of titanium was attached to the first electrode 70, while a square glass substrate with each side 6 inches (6 inch corresponds to 15.24 cm) long was attached to the second electrode 72. In the next step, high-frequency power having a frequency of approximately 13.6 MHz was supplied from the first AC power supply 75 to the first electrode 70, and sputtering using a negative electric potential of −200 V, supplied form the DC power supply 78, was performed so as to form the above titanium film.

In the following step, after an Ar gas atmosphere was generated in the film formation chamber 60, target 71 made of Cu was attached to the first electrode 70, while the glass substrate was still attached to the second electrode 72. Under these conditions, DC power was applied to the target 71 from the DC power supply 78, while AC power was applied to the glass substrate from the second AC power supply 80 so as to perform the two-frequency excited sputtering. As a result, a Cu film having a thickness of 150 nm was formed on the titanium film. The above AC power applied to the glass substrate was 200 W.

The Cu film was then coated with a resist so as to perform the pattern exposure, and unnecessary portions in the Cu and titanium films were removed using an etching material, and the photosensitive resist was then removed. Accordingly, the stacked (or multi-layered) titanium and Cu films were formed.

The above substrate on which the stacked films were formed was then annealing-processed in a nitrogen gas atmosphere for two hours at 400° C. so as to form wiring. The wiring arrangement obtained in this specific example 1 was analyzed using the Auger Electron Spectroscopy analysis method. According to the results of the analysis, a coating film including Ti (titanium) was formed around the Cu layer, and the thickness of the coating film was 10 nm. The resistivity (or sheet resistance) of the wiring of the specific example 1 was also measured, and the measured result was 0.27 Ω, which was not changed before and after the annealing.

SPECIFIC EXAMPLE 2

Wiring was formed under the same conditions as those of the above specific example 1 except for using the AC power of 100 W applied to the glass substrate. The wiring arrangement obtained in this specific example 2 was also analyzed using the Auger Electron Spectroscopy analysis method. According to the results of the analysis, a coating film including Ti was formed around the Cu layer, and the thickness of the coating film was 8 nm. The resistivity (or sheet resistance) of the wiring of the specific example 2 was also measured, and the measured result was 0.23 Ω.

COMPARATIVE EXAMPLE 1

Wiring was formed under the same conditions as those of the above specific example 1 except for using the AC power of 0 W applied to the glass substrate (i.e., no AC power was applied). The wiring arrangement obtained in this comparative example 1 was also analyzed using the Auger Electron Spectroscopy analysis method. According to the results of the analysis, a coating film including Ti was formed around the Cu layer, and the thickness of the coating film was 4 nm. The resistivity (or sheet resistance) of the wiring of the comparative example 1 was also measured, and the measured result was 0.23 Ω.

According to the results of the specific example 1 and 2 and comparative example 1, the higher the AC power applied to the glass substrate, the thicker the coating film formed around the Cu layer is.

COMPARATIVE EXAMPLE 2

The thin-film formation apparatus as shown in FIGS. 4 to 6 was used also in this comparative example. After an Ar gas atmosphere was generated in the film formation chamber 60, target 71 made of Cu was attached to the first electrode 70, while a glass substrate was attached to the second electrode 72. Under these conditions, DC power was applied to the target 71 from the DC power supply 78, while AC power was applied to the glass substrate from the second AC power supply 80 so as to perform the two-frequency excited sputtering. As a result, a Cu film having a thickness of 150 nm was formed. The above AC power applied to the glass substrate was 200 W.

The Cu film was then coated with a resist so as to perform the pattern exposure, and unnecessary portions in the Cu film were removed using an etching material, and the photosensitive resist was then removed. Accordingly, the Cu layer and necessary wiring was formed. The resistivity(or sheet resistance) of the wiring of the comparative example 2 was 0.20 Ω.

COMPARATIVE EXAMPLE 3

Wiring was formed under the same conditions as those of the above comparative example 2 except for using the AC power of 100 W applied to the glass substrate. The resistivity (or sheet resistance) of the wiring of the comparative example 3 was also measured, and the measured result was 0.18 Ω.

EXPERIMENTAL EXAMPLE 1

Chemical (solution) resistance of each wiring obtained by the specific examples 1 and 2, and comparative examples 1 to 3 were analyzed. In the analysis, each wiring was immersed in an ammonium persulfate etchant for 60 seconds, and the wiring was then pulled out of a detaching solvent, and rinsed and dried. The surface conditions of each wiring before and after the immersing in the etchant were observed and analyzed using an atomic force microscope (AFM).

Figure 15:
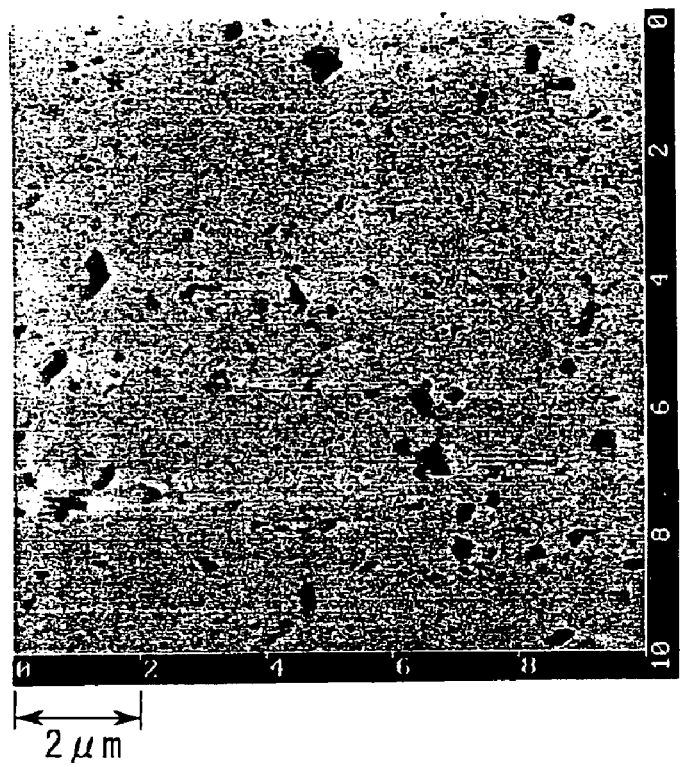
FIG. 15 is a photograph showing the metallographic structure on the surface of the wiring of the specific example 1 after the wiring was immersed in the etchant.
Figure 16:
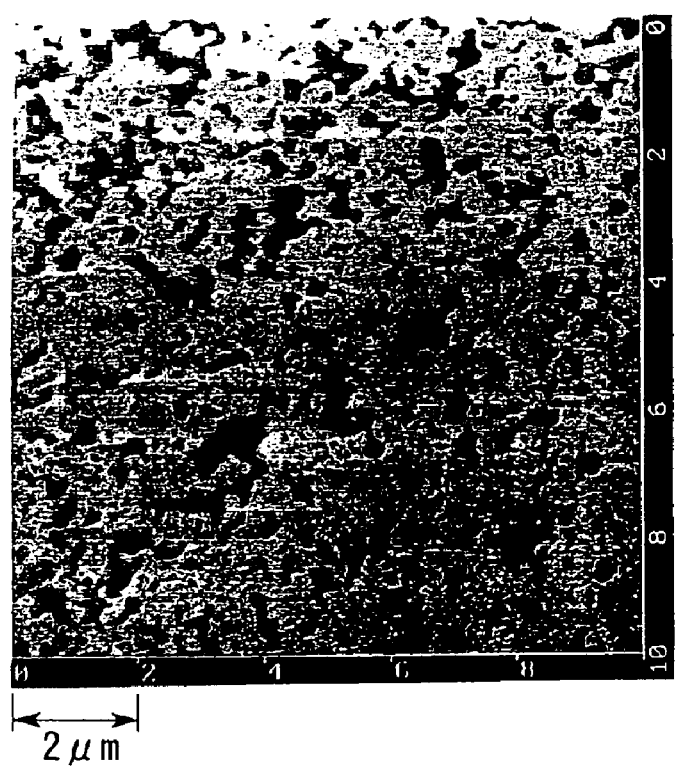
FIG. 16 is a photograph showing the metallographic structure on the surface of the wiring of the specific example 2 after the wiring was immersed in the etchant.
Figure 17:
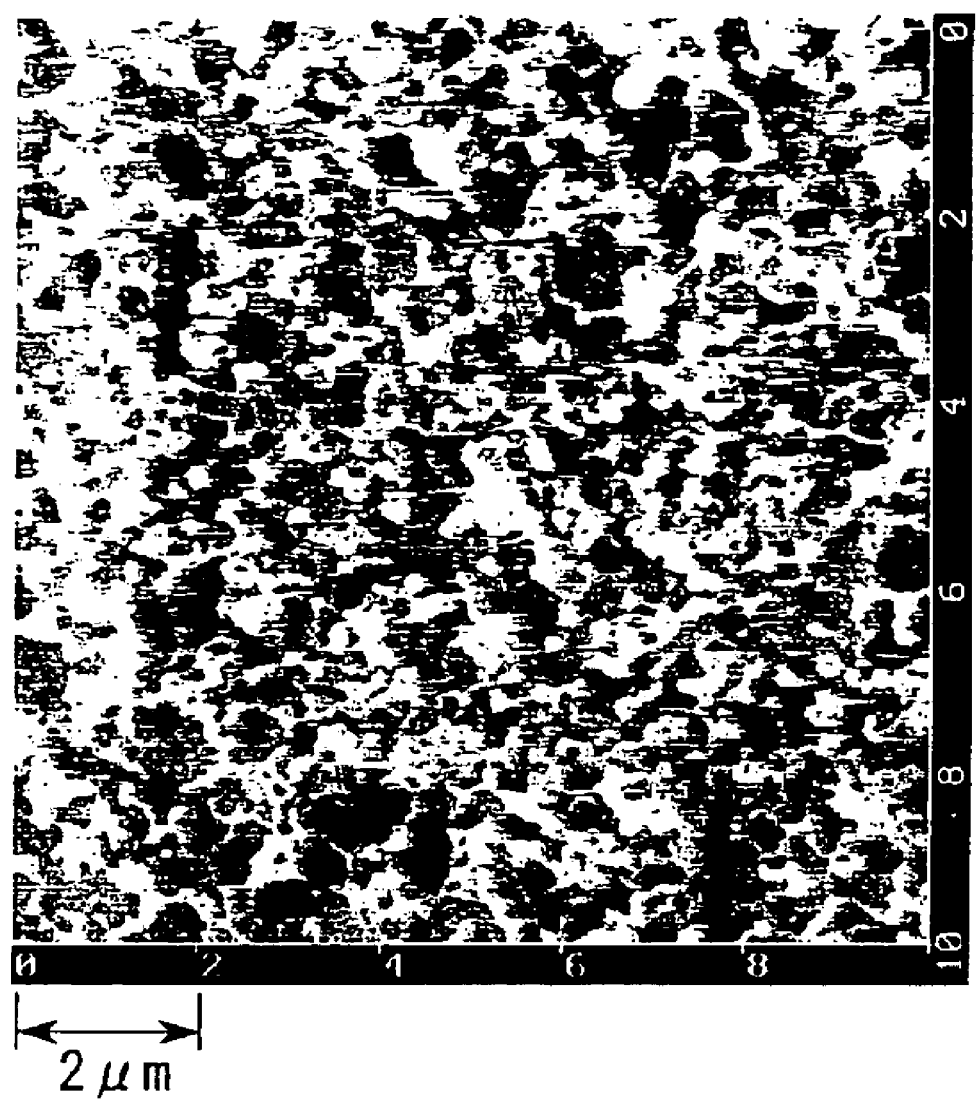
FIG. 17 is a photograph showing the metallographic structure on the surface of the wiring of the comparative example 1 after the wiring was immersed in the etchant.

The observed results are shown in FIGS. 15 to 17. FIG. 15 is a photograph showing the metallographic structure on the surface of the wiring of the above specific example 1 after the wiring was immersed in the ammonium persulfate etchant. FIG. 16 is a photograph showing the metallographic structure on the surface of the wiring of the above specific example 2 after the wiring was immersed in the ammonium persulfate etchant. FIG. 17 is a photograph showing the metallographic structure on the surface of the wiring of the above comparative example 1 after the wiring was immersed in the ammonium persulfate etchant.

The etching rate of each wiring was also measured.

As for the wiring of the specific example 1, the etching rate before the annealing was 132 nm/min, and the etching rate after the annealing and the following retention time of approximately 3 minutes was 132 nm/min, that is, the same value as that obtained before the annealing.

As for the wiring of the specific example 2, the etching rate before the annealing was 126 nm/min, and the etching rate after the annealing and the following retention time of 1 minute or more was 126 nm/min, that is, the same value as that obtained before the annealing.

As for the wiring of the comparative example 1, the etching rate before the annealing was 128 nm/min, and the etching rate after the annealing and the following retention time of less than 1 minute was 128 nm/min, that is, the same value as that obtained before the annealing.

Similarly, the etching rates of the wiring of comparative examples 2 and 3 were respectively 127 nm/min and 128 nm/min, and these rates were not changed after the annealing process similar to the annealing of the specific example 1.

As clearly understood according to the photographs in FIGS. 15 to 17 and the measured results of the etching rate, (i) in the wiring of the comparative example 1 (using the AC power of 0 W applied to the substrate) or in the wiring of the comparative examples 2 and 3 (in which only the Cu layer was formed), the etching rate relating to the etchant is already large immediately after the start of the etching, and (ii) in the wiring of the comparative example 1, almost all of the Cu film was etched (the surface protective rate is 7%). Therefore, it is obvious that the wiring was severely damaged by the etchant. In contrast, the wiring of the specific examples 1 and 2 had the retention time of approximately 1 minute or more during which the etching did not proceed, and the surface protective ratio of the wiring of the specific example 1 which used the AC power of 200 W (applied to the substrate) was 90%, while the surface protective ratio of the wiring of the specific example 2 which used the AC power of 100 W (applied to the substrate) was 60%. In addition, in the wiring of the specific examples 1 and 2, the surface conditions before and after the immersing in the etchant were not remarkably different; thus, it is obvious that the wiring of the specific examples 1 and 2 has superior chemical resistance in comparison with the comparative example 1. The above "surface protective ratio" is a ratio of the total remaining surface area of the wiring after the immersing in the etchant to the surface area of the wiring before the immersing (i.e., 100%).

Additionally, in the wiring of the specific examples 1 and 2, the resistivity values before and after the annealing did not have significant difference.

Figure 18:
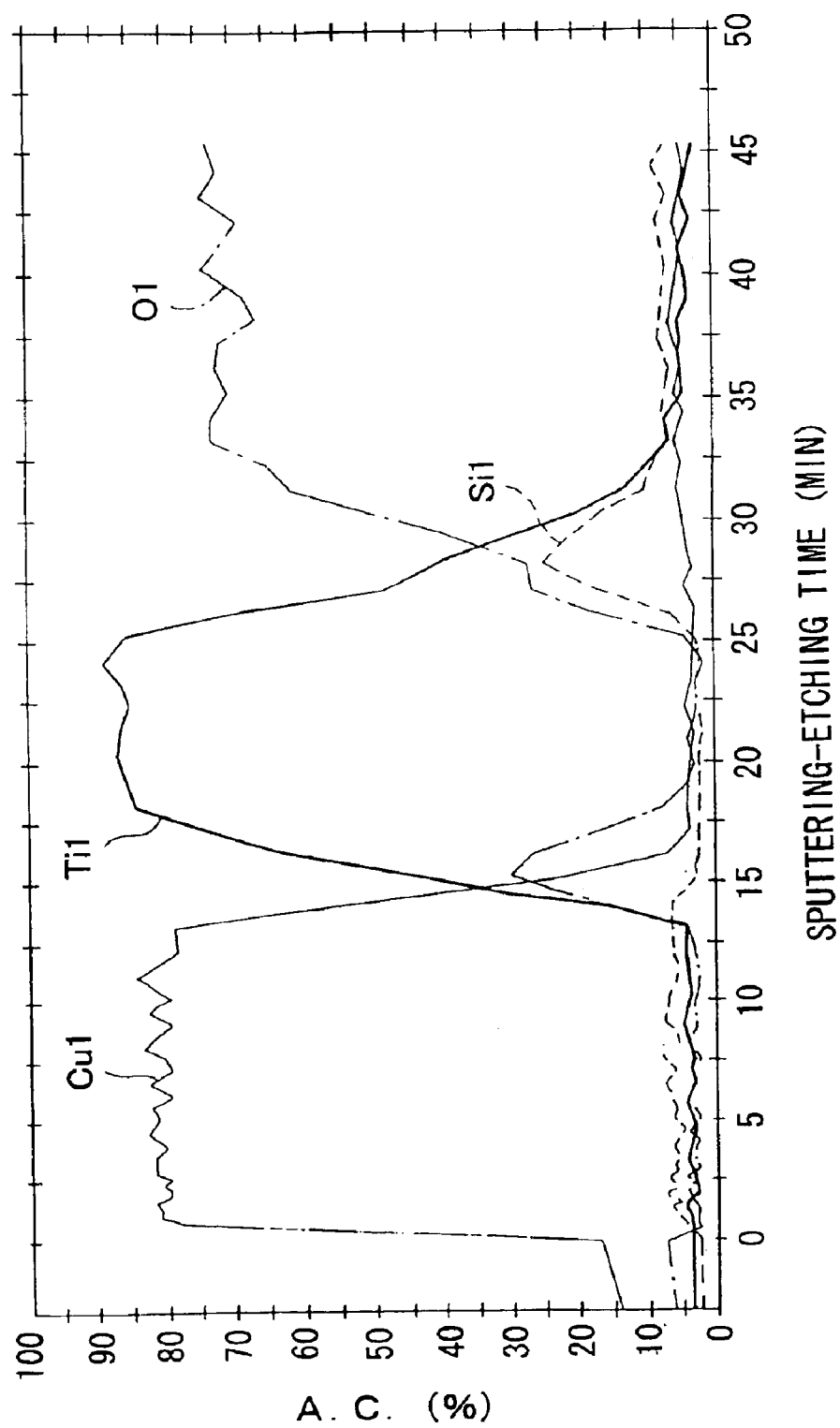
FIG. 18 is a graph showing the structure of the wiring of specific example 1 before the annealing, analyzed using the Auger Electron Spectroscopy analysis method.
Figure 19:
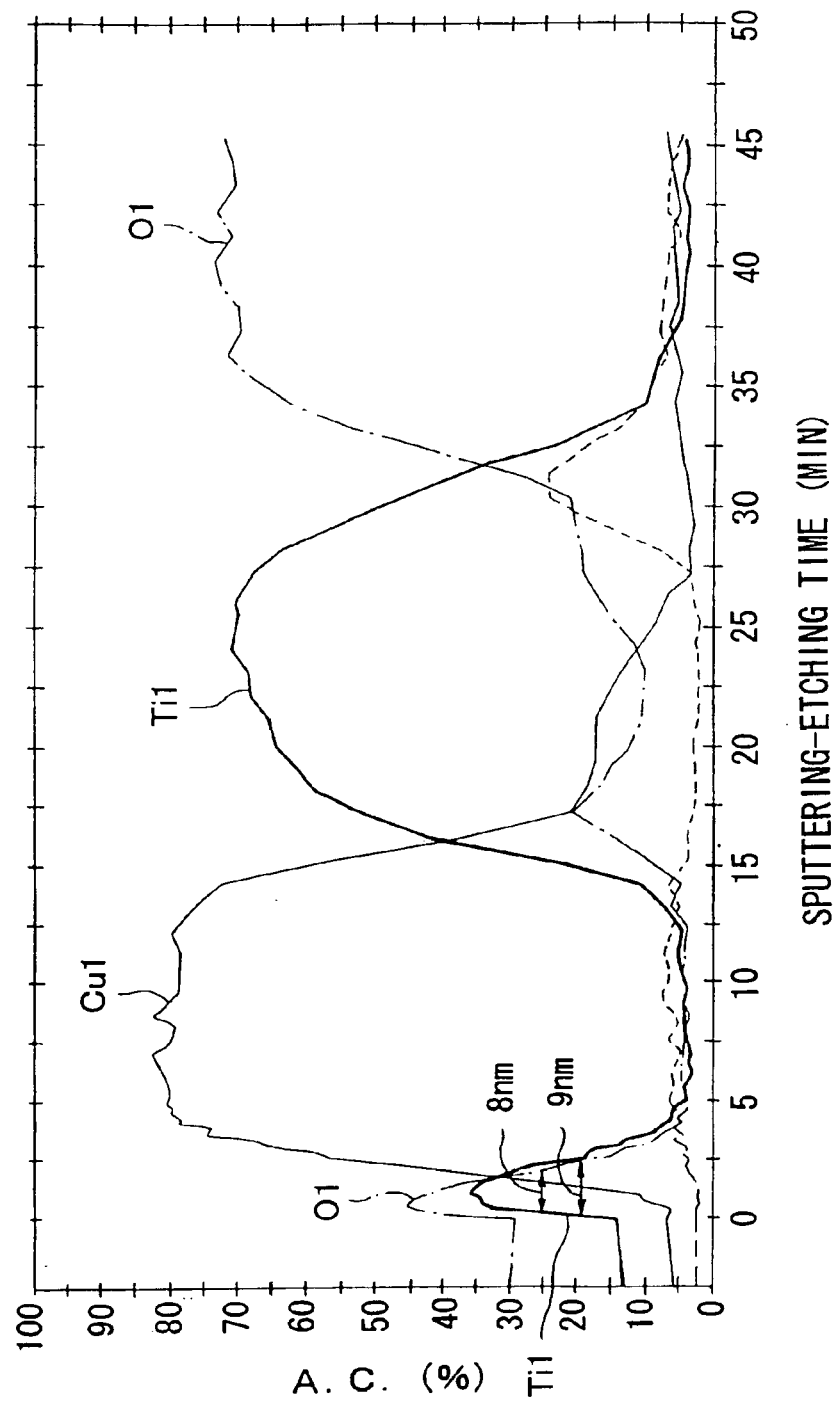
FIG. 19 is a graph showing the structure of the wiring of specific example 1 after the annealing, analyzed using the Auger Electron Spectroscopy analysis method.

FIGS. 18 to 19 are graphs explaining the structures of the wiring of specific example 1 before and after the annealing, analyzed using the Auger Electron Spectroscopy analysis method. FIG. 18 shows a depth profile of the wiring before the annealing, while FIG. 19 is a depth profile of the wiring after the annealing.

According to the results shown in the FIGS. 18 and 19, it is obvious that before the annealing, (i) the content of Ti existing between the glass substrate and the Cu layer is large, (ii) Ti in the Cu layer is very small, and (iii) the Ti content in the surface of the Cu layer is almost zero. The inventors believe that the reason why the Cu layer includes Ti is that AC power was applied to the substrate when the Cu film was sputtering-formed. In contrast, after the annealing, the content of Ti existing between the glass substrate and the Cu layer is smaller in comparison with the content before the annealing, and the peaks of Ti and O are observed at the surface side of the Cu layer. Accordingly, it is obvious that the Ti and O contents are larger than those measured before the annealing. Consequently, it is obvious that Ti dispersed towards the surface of the Cu layer due to the annealing.

SPECIFIC EXAMPLE 3

Instead of target 71 made of Ti, target 71 made of Cr (chromium) was used so as to form a Cr film on a glass substrate and to form necessary wiring. Other conditions were the same as those of the specific example 1. The resistivity(or sheet resistance) of the wiring of the specific example 3 was also measured, and the measured result was 0.14 Ω.

SPECIFIC EXAMPLE 4

Under the same conditions as those of the specific example 3, except for using 100 W of the AC power applied to the glass substrate, wiring was formed. The resistivity(or sheet resistance) of the wiring of the specific example 4 was also measured, and the measured result was 0.14 Ω.

COMPARATIVE EXAMPLE 4

Under the same conditions as those of the specific example 3, except for using 0 W of the AC power applied to the glass substrate, wiring was formed. The resistivity(or sheet resistance) of the wiring of the comparative example 4 was also measured, and the measured result was 0.14 Ω.

EXPERIMENTAL EXAMPLE 2

Chemical resistance of each wiring obtained by the specific examples 3 and 4, and comparative example 4 were analyzed in a way similar to that of the above-explained experimental example 1.

Figure 20:
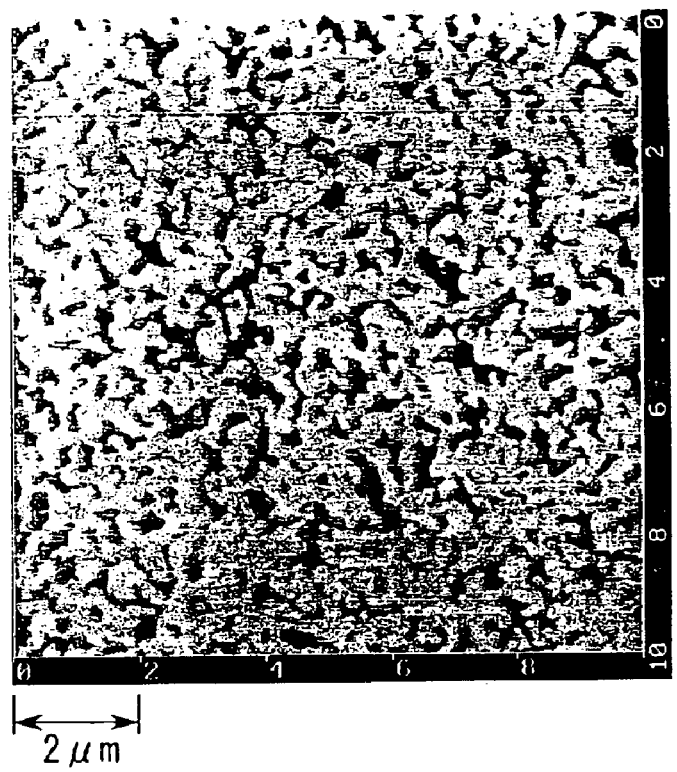
FIG. 20 is a photograph showing the metallographic structure on the surface of the wiring of the specific example 3 after the wiring was immersed in the etchant.
Figure 21:
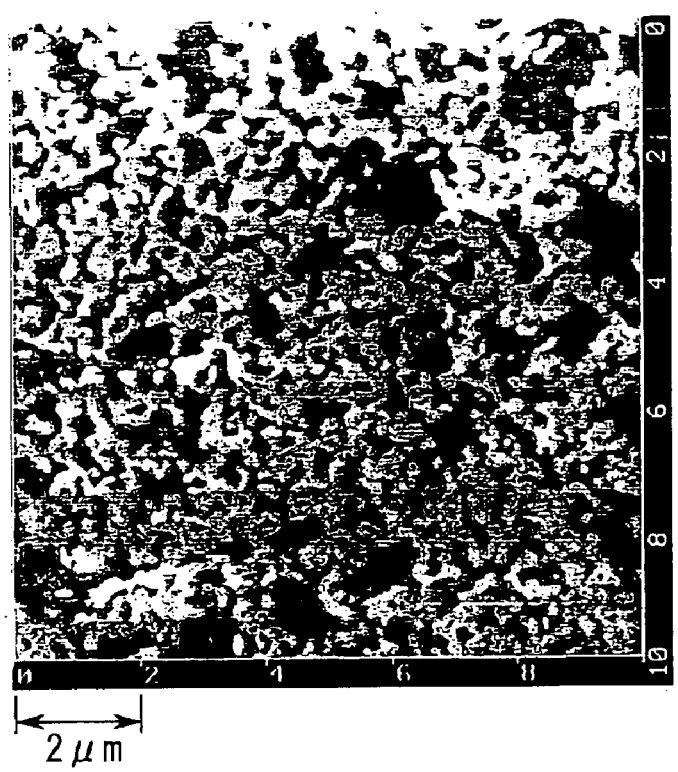
FIG. 21 is a photograph showing the metallographic structure on the surface of the wiring of the specific example 4 after the wiring was immersed in the etchant.
Figure 22:
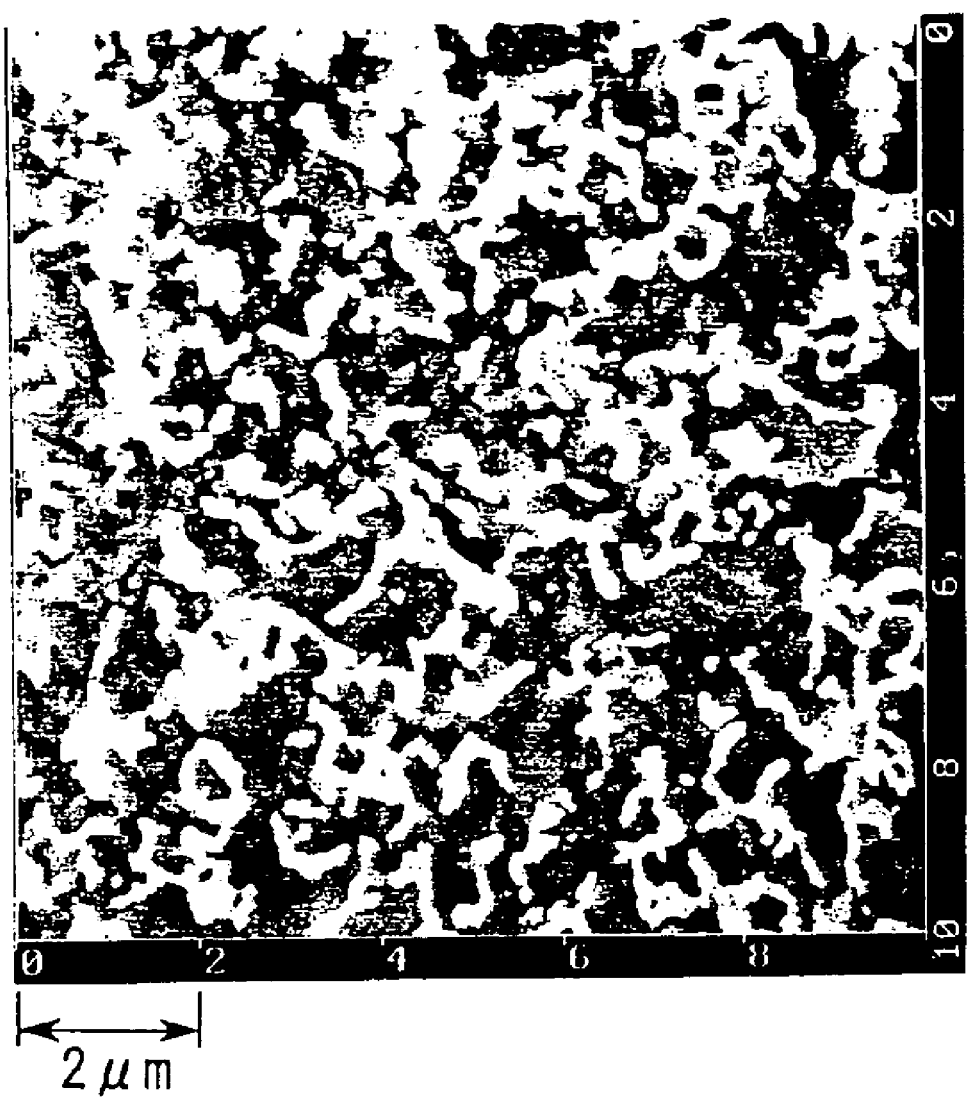
FIG. 22 is a photograph showing the metallographic structure on the surface of the wiring of the comparative example 4 after the wiring was immersed in the etchant.

The observed results are shown in FIGS. 20 to 22. FIG. 20 is a photograph showing the metallographic structure on the surface of the wiring of the above specific example 3 after the wiring was immersed in the ammonium persulfate etchant. FIG. 21 is a photograph showing the metallographic structure on the surface of the wiring of the above specific example 4 after the wiring was immersed in the ammonium persulfate etchant. FIG. 22 is a photograph showing the metallographic structure on the surface of the wiring of the above comparative example 4 after the wiring was immersed in the ammonium persulfate etchant.

The etching rate of each wiring was also measured.

As for the wiring of the specific example 3, the etching rate before the annealing was 128 nm/min, and the etching rate after the annealing and the following retention time of approximately 2 minutes was 128 nm/min, that is, the same value as that obtained before the annealing.

As for the wiring of the specific example 4, the etching rate before the annealing was 131 nm/mm, and the etching rate after the annealing and the following retention time of 1 minute or more was 131 nm/min, that is, the same value as that obtained before the annealing.

As for the wiring of the comparative example 4, the etching rate before the annealing was 127 nm/min, and the etching rate after the annealing and the following retention time of less than 1 minute was 127 nm/min, that is, the same value as that obtained before the annealing.

As clearly understood according to the photographs in FIGS. 20 to 22 and the measured results of the etching rate, (i) in the wiring of the comparative example 4 (using the AC power of 0 W applied to the substrate) or in the wiring of the comparative examples 2 and 3 (in which only the Cu layer was formed), the etching rate relating to the etchant is already large immediately after the start of the etching, and (ii) in the wiring of the comparative example 4, almost all of the Cu film was etched (the surface protective ratio was 15%). Therefore, it is obvious that this wiring was severely damaged by the etchant. In contrast, the wiring of the specific examples 3 and 4 had the retention time of approximately 1 minute or more during which the etching did not proceed, and the surface protective ratio of the wiring of the specific example 3 which used the AC power of 200 W applied to the substrate was 70%, while the surface protective ratio of the wiring of the specific example 4 which used the AC power of 100 W applied to the substrate was 50%. In addition, in the wiring of the specific examples 3 and 4, the surface conditions before and after the immersing (in the etchant) were not remarkably different; thus, it is obvious that the wiring of the specific examples 3 and 4 has superior chemical resistance in comparison with the comparative example 4.

Additionally, in the wiring of the specific examples 3 and 4, the resistivity values before and after the annealing did not have significant difference.

Figure 23:
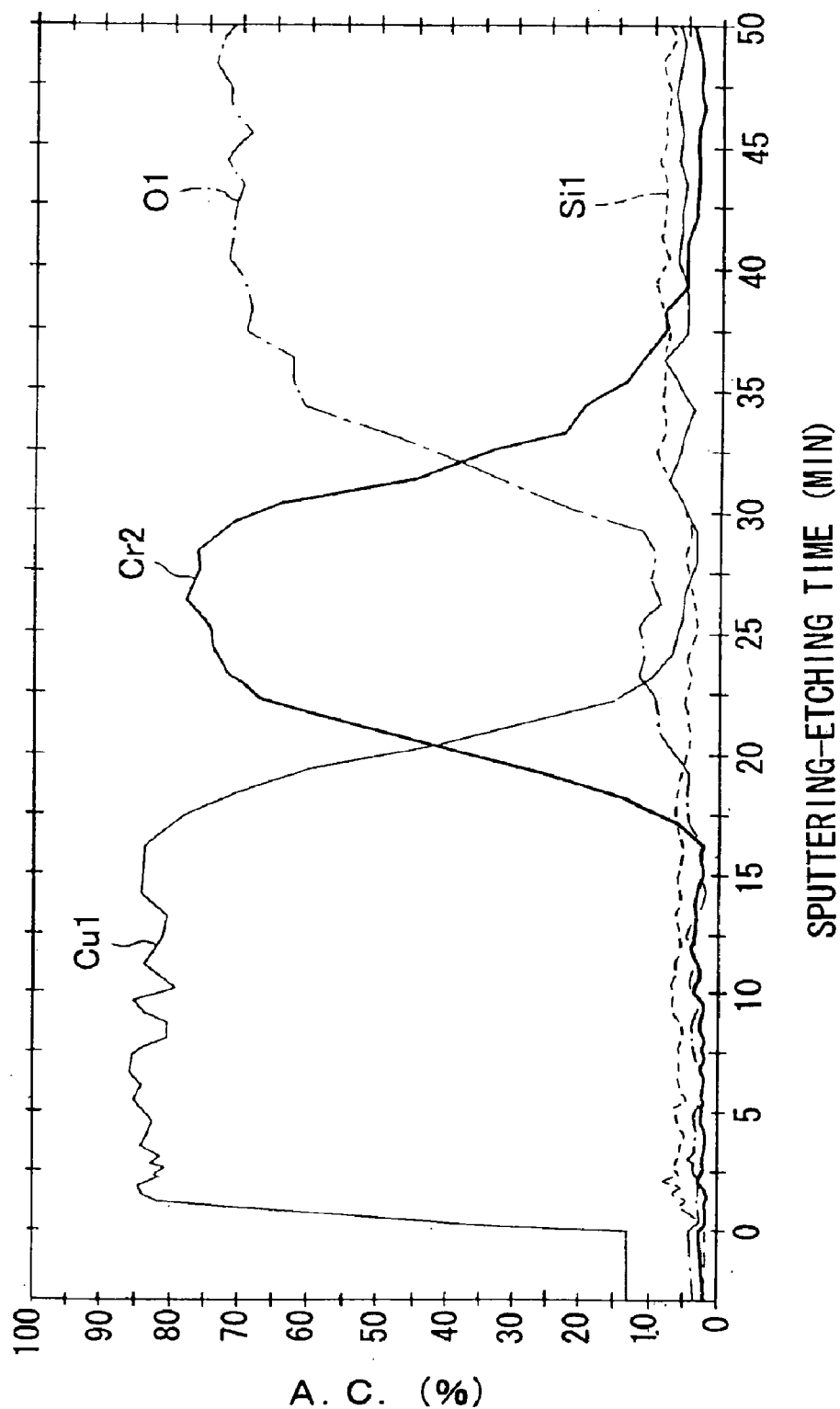
FIG. 23 is a graph showing the structure of the wiring of specific example 3 before the annealing, analyzed using the Auger Electron Spectroscopy analysis method.
Figure 24:
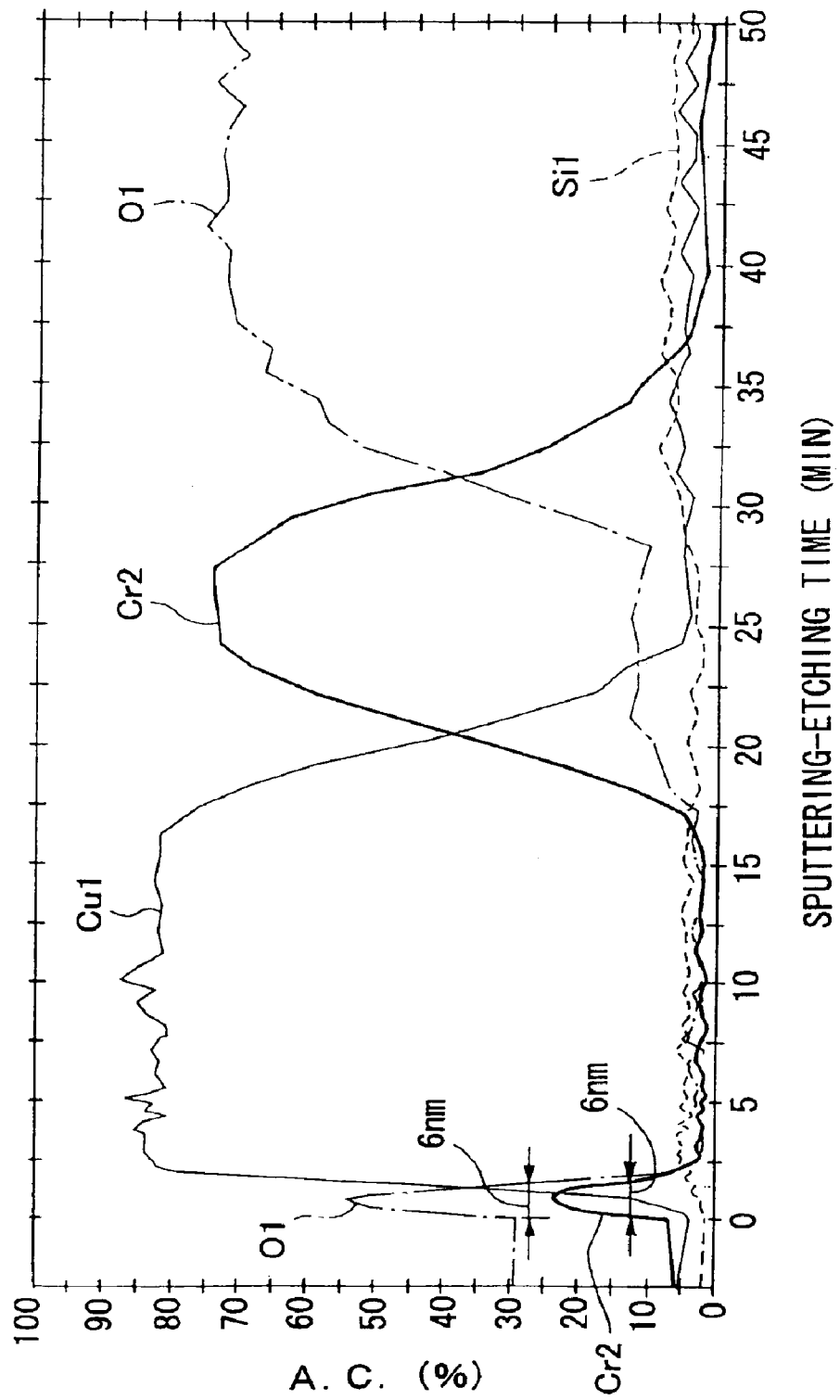
FIG. 24 is a graph showing the structure of the wiring of specific example 3 after the annealing, analyzed using the Auger Electron Spectroscopy analysis method.

FIGS. 23 to 24 are graphs explaining the structures of the wiring of specific example 3 before and after the annealing, analyzed using the Auger Electron Spectroscopy analysis method. FIG. 23 shows a depth profile of the wiring before the annealing, while FIG. 24 is a depth profile of the wiring after the annealing.

According to the results shown in the FIGS. 23 and 24, it is obvious that before the annealing, (i) the content of Cr existing between the glass substrate and the Cu layer is large, (ii) Cr in the Cu layer is very small, and (iii) the Cr content in the surface of the Cu layer is almost zero. The inventors believe that the reason why the Cu layer includes Cr is that AC power was applied to the substrate when the Cu film was sputtering-formed. On the other hand, after the annealing, the content of Cr existing between the glass substrate and the Cu layer is smaller in comparison with the content before the annealing, and the peaks of Cr and O are observed at the surface side of the Cu layer. Accordingly, it is obvious that the Cr and O contents are larger than those measured before the annealing. Consequently, it is obvious that Cr (atoms) dispersed towards the surface of the Cu layer due to the annealing.

EXPERIMENTAL EXAMPLE 3

Instead of target 71 made of Ti, target 71 made of Mo (molybdenum) was used for form an Mo film and relevant wiring on a glass substrate under the same conditions as those of the specific example 1 except for changing the AC power applied to the glass substrate within the range from 0 to 200 W. The relationship between the coating film formed on the Cu layer and the AC power applied to the glass substrate was analyzed. As a result, the coating film obtained when the AC power was 200 W had a thickness of 7 nm, the coating film obtained when the AC power was 100 W had a thickness of 6 nm, and the coating film obtained when the AC power was 0 W had a thickness of 2 nm. Accordingly, it is obvious that the higher the AC power applied to the glass substrate, the thicker the coating film including Mo formed on the Cu layer becomes.

EXPERIMENTAL EXAMPLE 4

A TiN film having a thickness of 50 nm was formed by using the thin-film formation apparatus as shown in FIGS. 4 to 6. In the processes, after an "Ar and $N_2$" mixed gas atmosphere was generated in the film formation chamber 60, target 71 made of Ti was attached to the first electrode 70, while a square glass substrate with each side 6 inches(6 ich corresponds to 15.24 cm) long was attached to the second electrode 72. In the next step, high-frequency power having a frequency of approximately 13.6 MHz was supplied from the first AC power supply 75 to the first electrode 70, and sputtering using a negative electric potential of –200 V, supplied form the DC power supply 78, was performed so as to form the above TiN film.

In the following step, after an Ar gas atmosphere was generated in the film formation chamber 60, target 71 made of Ti was attached to the first electrode 70, while the glass substrate with each side 6 inches long was still attached to the second electrode 72. Under these conditions, high-frequency power having a frequency of approximately 13.6 MHz was supplied from the first AC power supply 75 to the first electrode 70, and sputtering was performed using a negative electric potential of –200 V supplied from the DC power supply 78, so that a Ti film having a thickness of 20 nm was formed on the glass substrate.

In the following step, after an Ar gas atmosphere was generated in the film formation chamber 60, target 71 made of Cu was attached to the first electrode 70, while the glass substrate was still attached to the second electrode 72. Under these conditions, DC power was applied to the target 71 from the DC power supply 78, while AC power was applied to the glass substrate from the second AC power supply 80 so as to perform the two-frequency excited sputtering. As a result, a Cu film having a thickness of 140 nm was formed on the Ti film, so that a multi-layered film consisting of the TiN film, Ti film, and Cu film was obtained. The above AC power applied to the glass substrate was 200 W.

In the next step, the substrate on which the above multi-layered film was formed was annealing-processed in a nitrogen gas atmosphere at 400° C. for 2 hours, so that specimen (or test piece) 1 was obtained.

Specimen 2 was also formed by a method similar to the above method except for the conditions that the thickness of the Cu layer was 150 nm, and the temperature in the annealing process was 500° C.

In addition, an a-Si (or i-Si) layer having a thickness of 100 nm was formed by using the thin-film formation apparatus as shown in FIGS. 4 to 6. In the processes, after an "$SiH_4+H_2$" mixed gas atmosphere was generated in the film formation chamber 60, dummy target 71a was attached to the first electrode 70, while glass substrate 36 was attached to the second electrode 72. In the next step, high-frequency power having a frequency of approximately 200 MHz was supplied from the first AC power supply 75 to the first electrode 70, and high-frequency power from the second AC power supply 80 was also supplied to the second electrode 72 so as to control the ion energy applied to the glass substrate 36. Accordingly, the above a-Si (or i-Si) layer was obtained.

In the following step, after an Ar gas atmosphere was generated in the film formation chamber 60, target 71 made of P-doped Si (for forming an a-Si: $n^+$ layer) was attached to the first electrode 70, and high-frequency power having a frequency of approximately 13.6 MHz was supplied from the first AC power supply 75 to the first electrode 70, and sputtering was performed using a negative electric potential of −200 V supplied from the DC power supply 78, so that an a-Si: n+(i.e., n+Si) layer having a thickness of 20 nm was formed on the a-Si layer.

In the following step, a TiN film having a thickness of 50 nm was formed on the a-Si: $n^+$ layer by a method similar to that used for forming the above specimen 1, and a Cu film having a thickness of 150 nm was further formed on the TiN film also by using the method similar to the method for forming specimen 1.

After that, this substrate was annealing-processed in a nitrogen atmosphere at 500° C. for 2 hours, so that specimen 3 was obtained.

Figure 25:
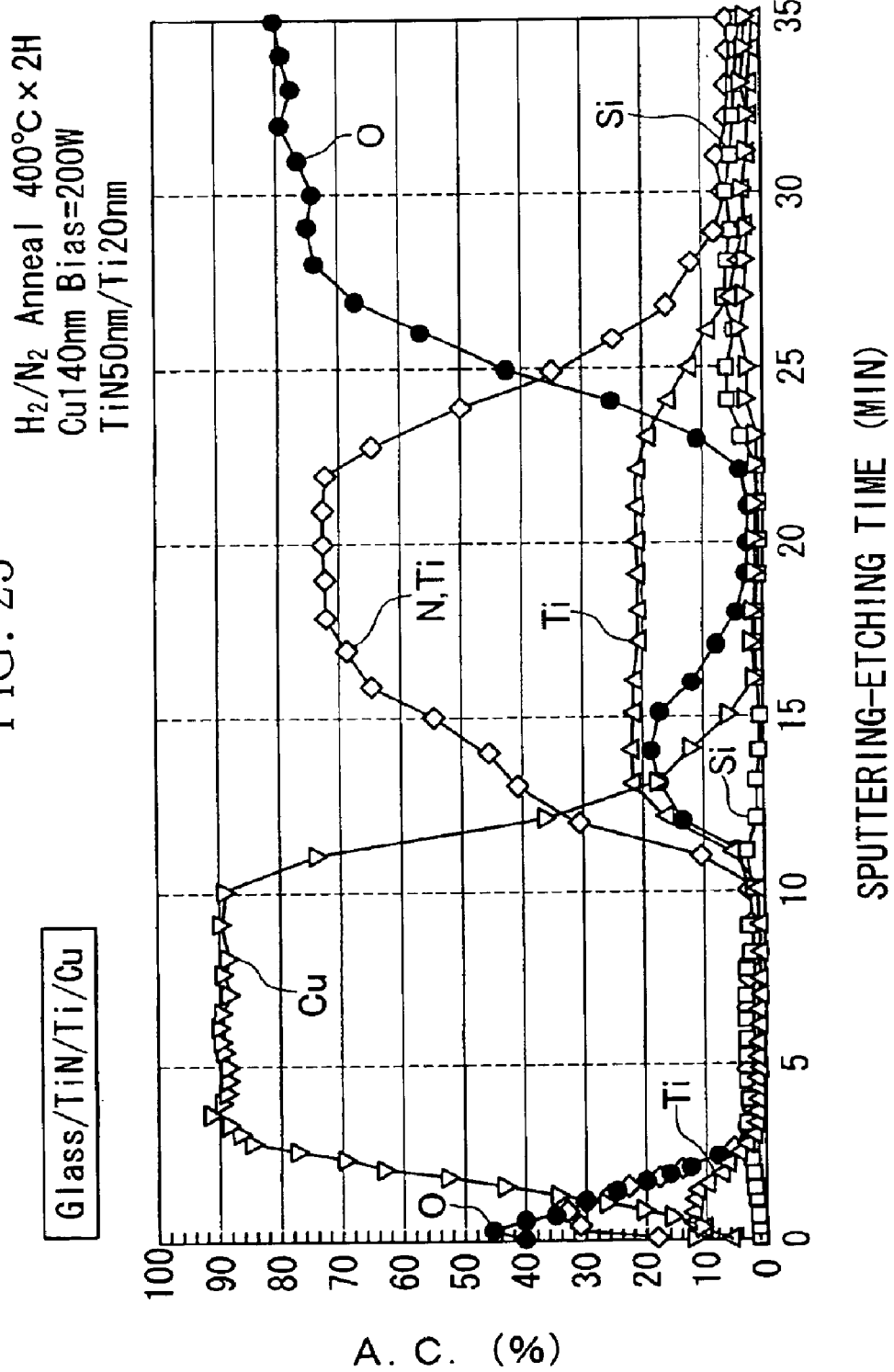
FIG. 25 is a graph showing the structure of specimen 1, analyzed using the Auger Electron Spectroscopy analysis method.
Figure 26:
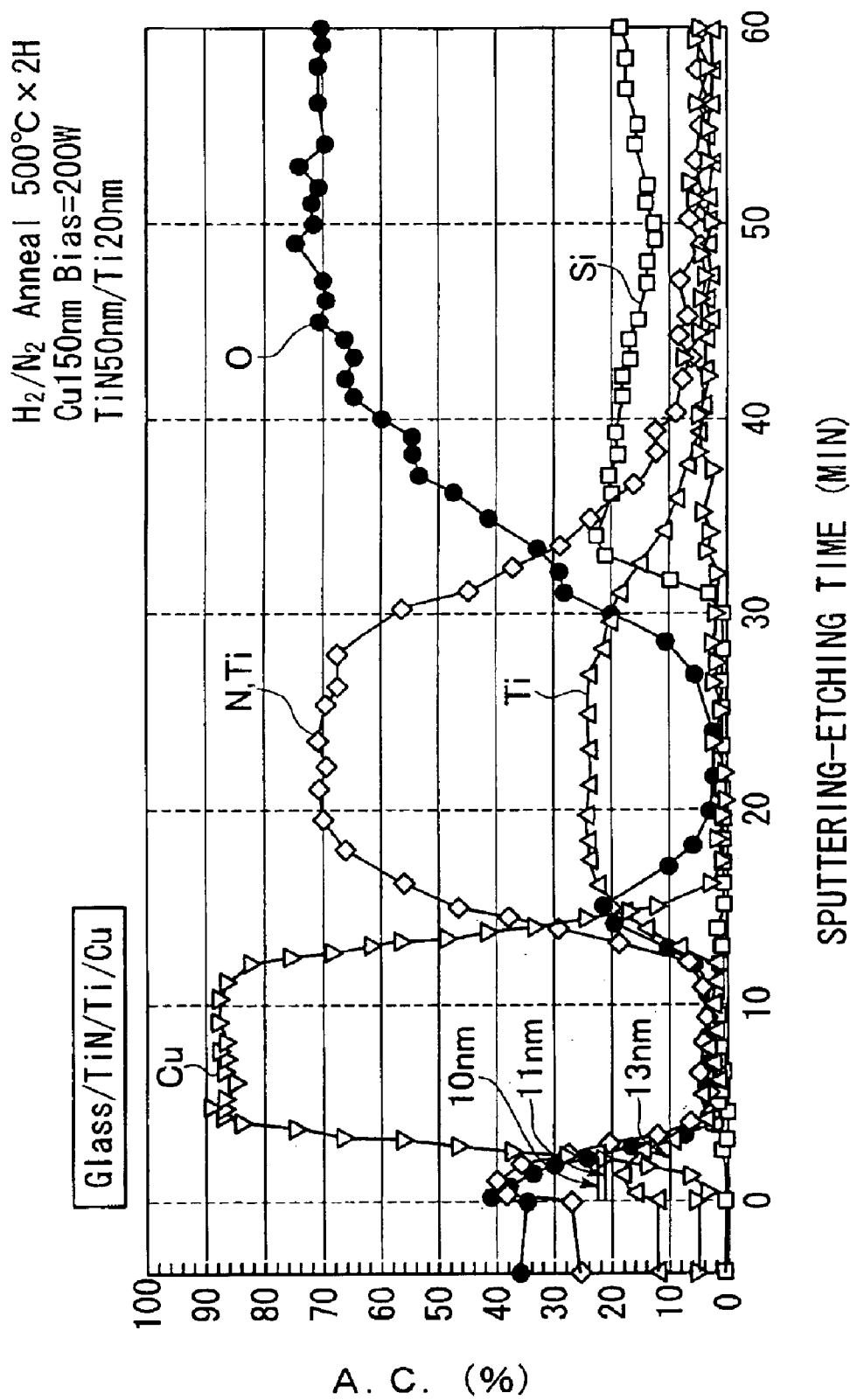
FIG. 26 is a graph showing the structure of specimen 2, analyzed using the Auger Electron Spectroscopy analysis method.
Figure 27:
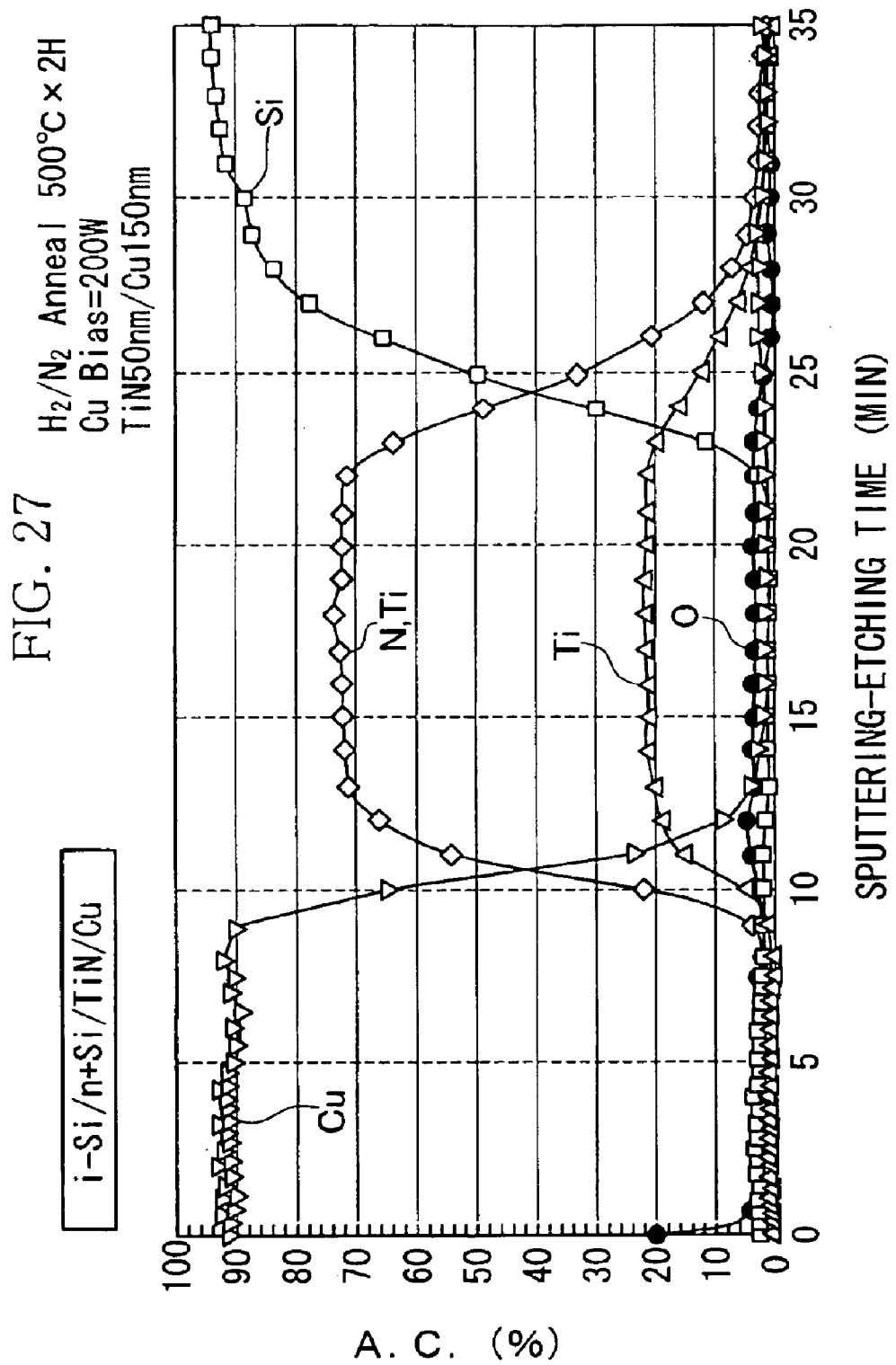
FIG. 27 is a graph showing the structure of specimen 3, analyzed using the Auger Electron Spectroscopy analysis method.

FIGS. 25 to 27 are graphs showing the structures of specimens 1 to 3 analyzed using the Auger Electron Spectroscopy analysis method. FIG. 25 shows a depth profile of specimen 1 which was annealing-processed at 400° C. for two hours. FIG. 26 shows a depth profile of specimen 2 which was annealing-processed at 500° C. for two hours. FIG. 27 shows a depth profile of specimen 3 which was annealing-processed at 500° C. for two hours.

According to the results shown in FIGS. 25 to 27, the specimen 3 which has no Ti film between the TiN film and Cu film has no peak of Ti (i.e., no Ti peak) at the surface side of the Cu film; thus, it is obvious that even with annealing at 500° C., Ti does not disperse towards the surface of the Cu film. In addition, between the Cu peak and Si peak (that is, between the Cu film and Si layer), an N peak indicated by "-◊-" and a Ti peak indicated by "-Δ-" are present. In addition, the N peak is larger than the Ti peak. Here, it is estimated that in the Auger Electron Spectroscopy analysis method, the N peak indicated by "-◊-" includes not only N but also Ti because a Ti peak in the vicinity of the N peak is also detected, and thus the content ratio of N to Ti is approximately 1:1. Therefore, it is obvious that a TiN film remains between the Cu film and the a-Si: $n^+$ layer.

The specimen 2, which has the Ti film between the TiN film and Cu film, has a Ti peak at the surface side of the Cu film; thus, it is obvious that Ti atoms disperse in the surface of the Cu film by annealing at 400° C. Between the Cu peak and the peak of O in the glass substrate, the N peak indicated by "-◊-" is larger than the Ti peak indicated by "-Δ-". According to a reason similar to that explained above, it is obvious that the TiN film remains. In addition, an O peak is present at the surface side of the Cu film. This is because a titanium oxide film was generated due to a reaction between O and Ti.

The specimen 3 has a larger Ti peak at the surface side of the Cu film in comparison with specimen 2, while the Ti peak indicated by "-Δ-" between the Cu peak and the peak of O in the glass substrate is smaller. Therefore, it is obvious that almost all Ti in the Ti film dispersed in the surface of the Cu film.

EXPERIMENTAL EXAMPLE 5

Specimen 4 was formed using the same method as that used for forming the above specimen 3 except for the annealing conditions.

On the other hand, specimens 5 to 8 were made by forming various kinds of metallic films, instead of the TIN film, on the a-Si: $n^+$ layer, using a method similar to that used for making the specimen 3 except for the annealing conditions. The various kinds of metallic films were (i) a Ti film having a thickness of 50 nm, (ii) a Cr film having a thickness of 50 nm, (iii) a Mo film having a thickness of 50 nm, and (iv) a TiN film having a thickness of 50 nm and a Ti film having a thickness of 20 nm.

Figure 28:
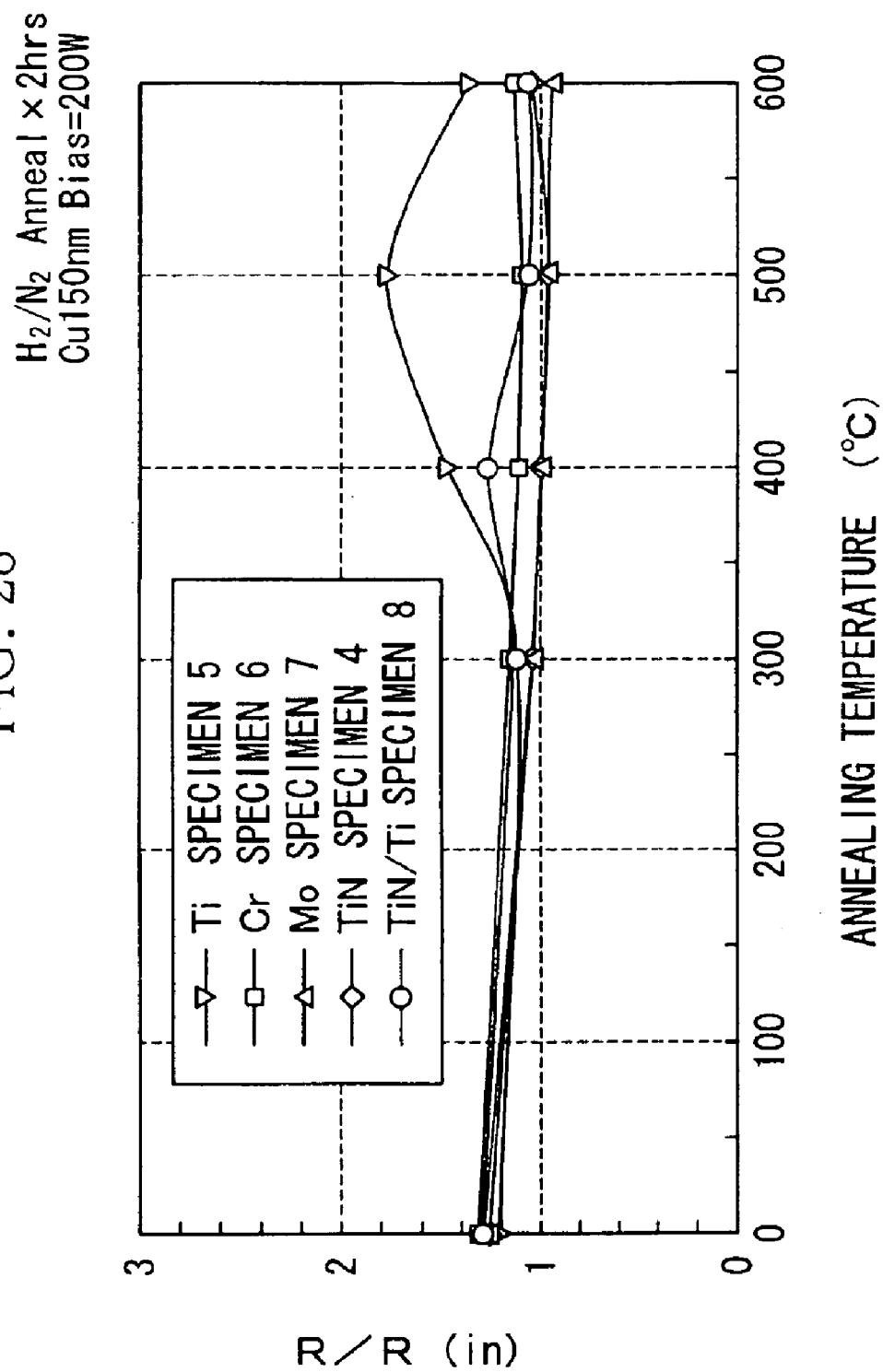
FIG. 28 is a graph showing the analyzed sheet resistance of the multi-layered film of specimens 4 to 8.

The sheet resistance of the multi-layered film of each specimen (4 to 8) was analyzed. The results of the analysis are shown in FIG. 28. In FIG. 28, the horizontal axis indicates the annealing temperature (° C.), while "R/R (in)" in the vertical axis indicates the ratio of the sheet resistance of the relevant multi-layered film to the sheet resistance of the Cu film.

According to FIG. 28, the sheet resistance (of the multi-layered film) of the specimen 5 (in which a Ti film is formed between the a-Si: $n^+$ layer and the Cu film) gradually increases after the annealing temperature exceeds 300° C., and at 400° C. of the annealing temperature, the sheet resistance of the multi-layered film is approximately 1.5 times as much as the sheet resistance of the Cu film and the maximum sheet resistance appears at 500° C. The reason for the increase of the sheet resistance according to the increase of the annealing temperature is that Cu atoms in the Cu film and elements in the metallic film at the base side disperse into each other, and thus the elements and Cu atoms exist as solid solution.

On the other hand, in the specimens 4 and 7 in which the TiN or Mo film is formed between the a-Si: $n^+$ layer and the Cu film, the sheet resistance is almost fixed even though the annealing temperature is changed; thus, it is obvious that the resistance of the relevant film is as low as the Cu film.

In the specimen 6 in which the Cr film is formed between the a-Si: $n^+$ layer and the Cu film, the relevant sheet resistance at 400° C. is approximately 1.1 times as much as the sheet resistance of the Cu film, and the sheet resistance does not remarkably change even though the annealing temperature is changed.

In the specimen 8 in which the TiN and Ti films are formed between the a-Si: n$^+$ layer and the Cu film, the relevant sheet resistance at 400° C. of the annealing temperature is approximately 1.3 times as much as the sheet resistance of the Cu film, but the sheet resistance is as low as that of the Cu film above 500° C. of the annealing temperature.

EXPERIMENTAL EXAMPLE 6

As for the above specimens 4 to 8, the dispersion state of each metallic film (TiN film, Ti film, Cr film, Mo film, and TiN and Ti films) under the Cu film, detected after the annealing process at 400° C. for 2 hours, was analyzed using the Auger Electron Spectroscopy analysis method. The following is result.

In the specimens 4 and 7, dispersion of the elements of the metallic film (i.e., the Mo film or TiN film) towards the surface of the Cu film was very small.

In contrast, in the specimens 5 and 6, analysis showed that a titanium oxide or chromium oxide film as a coating film having a thickness of approximately 10 nm was formed on the surface of the Cu film. In the specimen 8, analysis showed that a titanium oxide film as a coating film having a thickness of approximately 10 nm was formed on the surface of the Cu film.

EXPERIMENTAL EXAMPLE 7

As for the above specimens 4 to 7, the barrier function of the metallic film between the a-Si: n$^+$ layer and the Cu film was estimated. Here, the barrier function was estimated by measuring the sheet resistance detected when a voltage was applied to the Cu film. The results are shown in FIG. 29.

Figure 29:
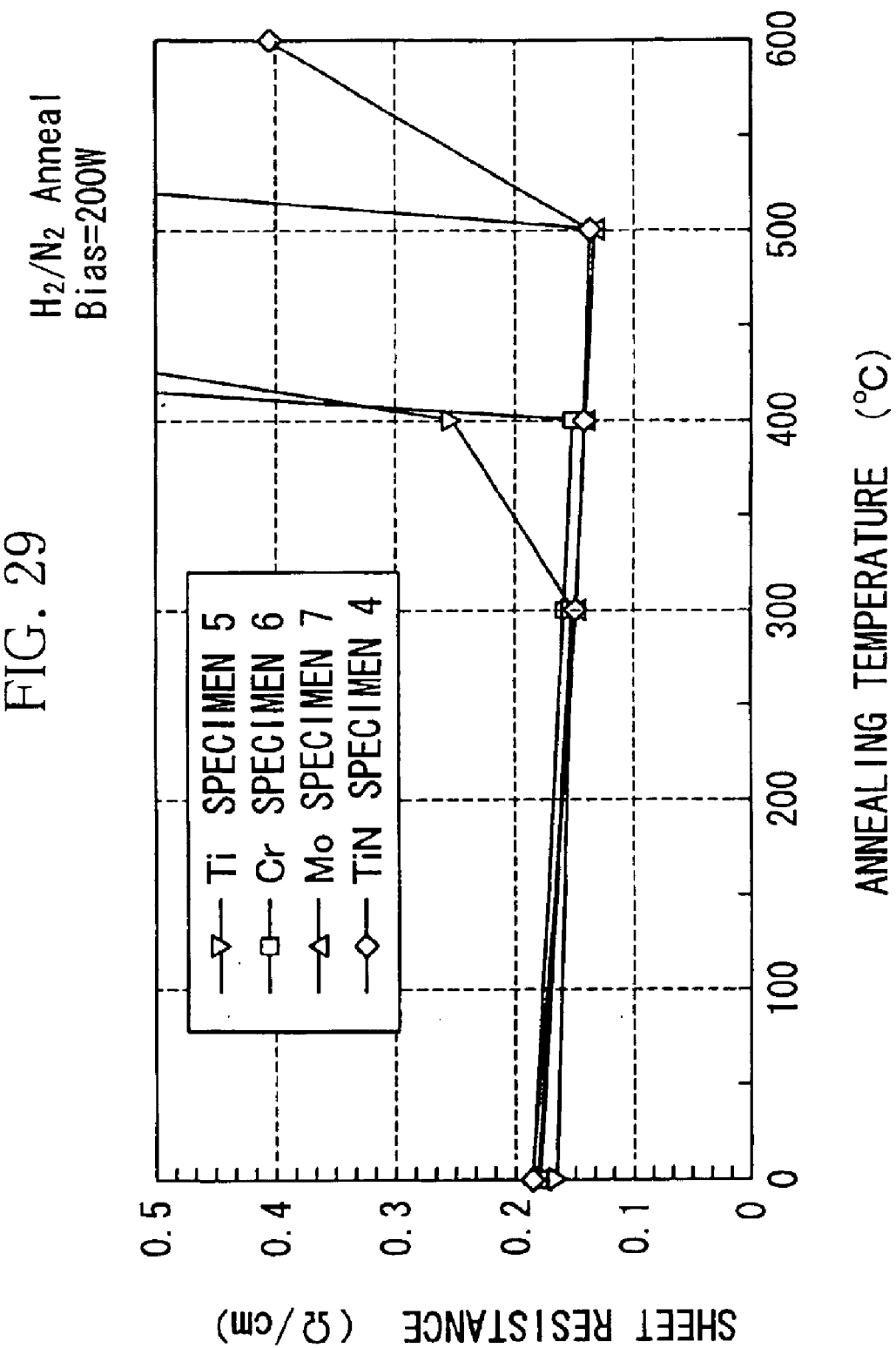
FIG. 29 is a graph showing the analyzed barrier function of the metallic film between the a–Si: n$^+$ layer and the Cu film of specimens 4 to 7.

According to FIG. 29, in the specimens 5 and 6 in which the Ti film or Cy film was formed between the a-Si: n$^+$ layer and the Cu film, the sheet resistance suddenly increases after the annealing temperature exceeds 400° C. In the specimen 7 in which the Mo film was formed between the a-Si: n$^+$ layer and the Cu film, the sheet resistance is almost fixed below the annealing temperature of 500° C., but suddenly increases after the annealing temperature exceeds 500° C. This sudden increase is caused by the metal-silicide reaction according to the increase of the annealing temperature, wherein the barrier function of the metallic film between the a-Si: n$^+$ layer and the Cu film is degraded and Si atoms in the a-Si: n$^+$ layer disperse and are incorporated in the Cu film.

On the other hand, in the specimen 4 in which the TiN film was formed between the a-Si: n$^+$ layer and the Cu film, the sheet resistance is almost fixed below 500° C., and even above 500° C., the sheet resistance increases much more slowly in comparison with the specimen 7.

Therefore, it is obvious that the TiN film has superior heat resistance in comparison with the Ti, Cr, and Mo films, and thus to use the TiN film is effective for preventing the element dispersion from an adjacent film.

EXPERIMENTAL EXAMPLE 8

Specimen 9 was formed, which does not have a TiN film between the glass substrate and the Ti film, and in which, before the Cu film was formed on the Ti film, a Ti oxide layer was removed by plasma-etching the surface of the Ti film. Except for annealing conditions, other conditions are similar to those for making the specimen 1.

In the above plasma-etching, an Ar gas atmosphere was generated in the film formation chamber 60, and dummy target 71a was attached to the first electrode 70 while the glass substrate on which the Ti film was formed was still attached to the second electrode 72. Under these conditions, high-frequency power is supplied from the first AC power source 75 to the first electrode 70, and floating of a negative electric potential was performed so as to generate plasma, and high-frequency power was also supplied to the second electrode 72 so as to apply AC power of approximately 200 W to the glass substrate for approximately 2 minutes.

Specimens 9 to 13 were also formed by a way similar to that for making specimen 10, except for the conditions that the AC power applied to the glass substrate in the plasma-etching of the surface of the Ti film was 50 W and the application time was 1 minute.

Figure 30:
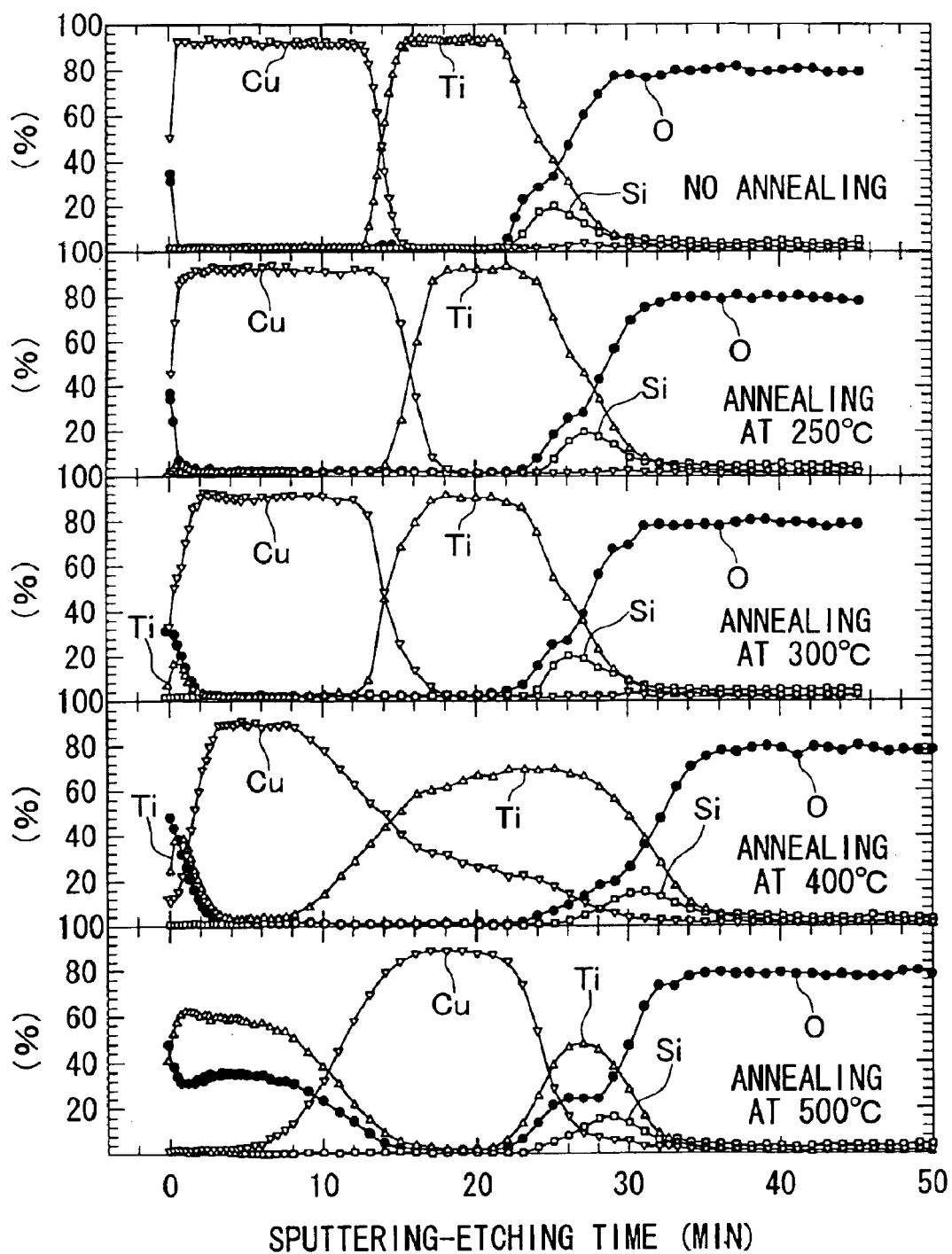
FIG. 30 is a graph showing the structures of the specimen 9 before the annealing process and after the annealing processes at various annealing temperatures in a range from 250 to 500° C., analyzed using the Auger Electron Spectroscopy analysis method.

FIG. 30 shows the structures of the specimen 9 before the annealing process and after the annealing processes at various annealing temperatures in a range from 250 to 500° C., analyzed using the Auger Electron Spectroscopy analysis method.

Figure 31:
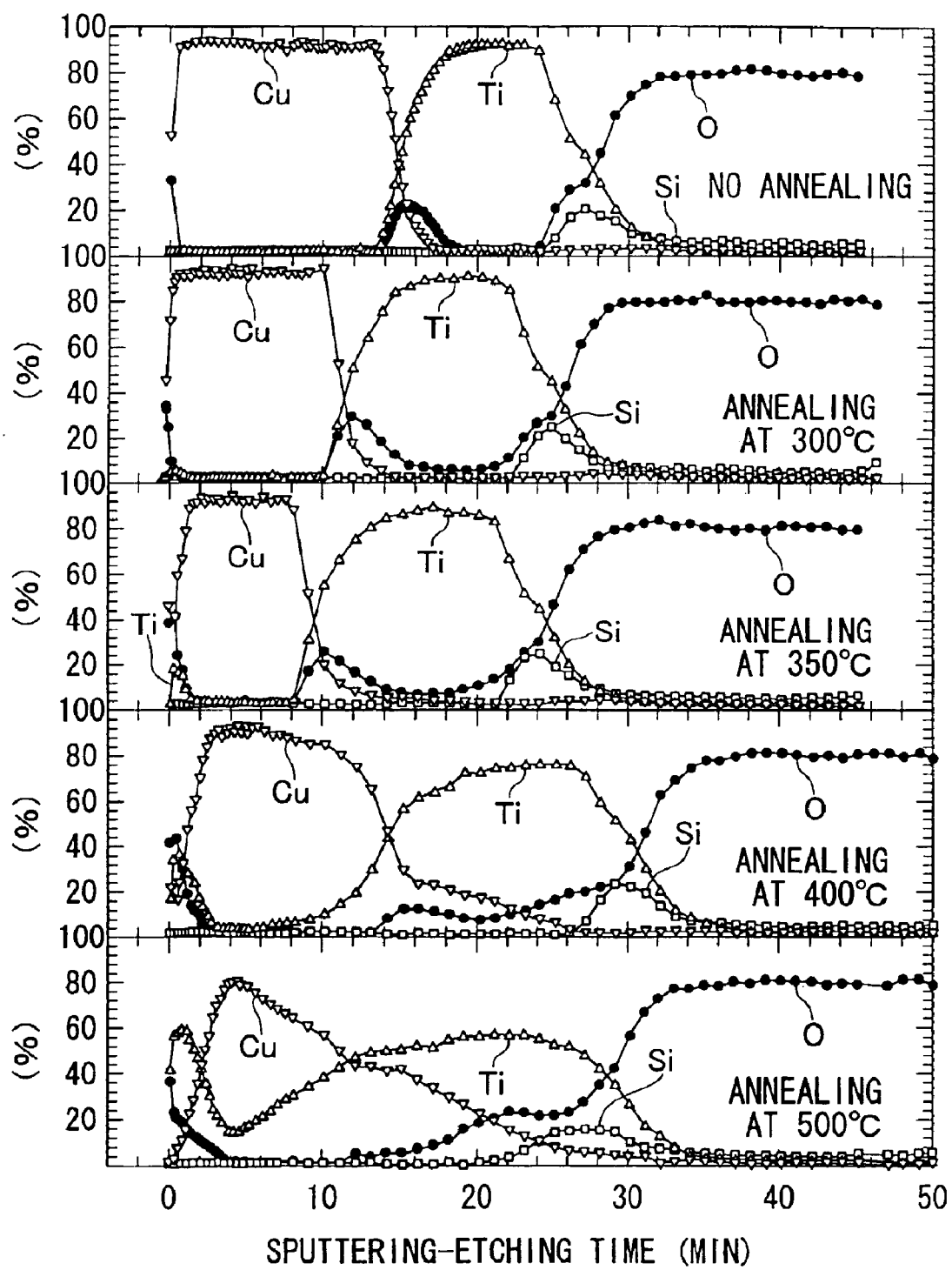
FIG. 31 is a graph showing the structures of the specimen 10 before the annealing process and after the annealing processes at various annealing temperatures from 300 to 500° C., analyzed using the Auger Electron Spectroscopy analysis method.

FIG. 31 shows the structures of the specimen 10 before the annealing process and after the annealing processes at various annealing temperatures from 300 to 500° C., analyzed using the Auger Electron Spectroscopy analysis method.

According to FIGS. 30 and 31, the specimen 10 before the annealing process has an O peak near the boundary between the Cu and Ti films; thus, it is obvious that a titanium oxide film was generated on the surface of the Ti film. In addition, the dispersion of Ti atoms towards the surface side of the Cu film begins at 350° C., and the amount of dispersion of Ti atoms towards the surface side of the Cu film increases according to the increase of the annealing temperature.

On the other hand, the specimen 9 before the annealing process has no O peak near the boundary between the Cu and Ti films; thus, it is obvious that the titanium oxide film was removed by the plasma etching. In addition, the dispersion of Ti atoms towards the surface side of the Cu film begins at 300° C.; thus, the dispersion of Ti starts at a lower temperature in comparison with the specimen 10. Therefore, it is obvious that removing of the titanium oxide film on the surface of the Ti film by using the plasma etching is effective for decreasing the temperature of annealing which is performed for dispersing Ti atoms towards the surface of the Cu film.

EXPERIMENTAL EXAMPLE 9

Specimens 11 to 14 were made by forming a SiO$_2$ film having a thickness of 300 nm between the TiN film and the glass substrate, and changing the thickness of the Ti film between the TiN film and the Cu film in a rage from 10 to 50 nm, and changing the annealing conditions. Other conditions are substantially the same as those used for making the specimen 3 in the experimental example 4.

Figure 32:
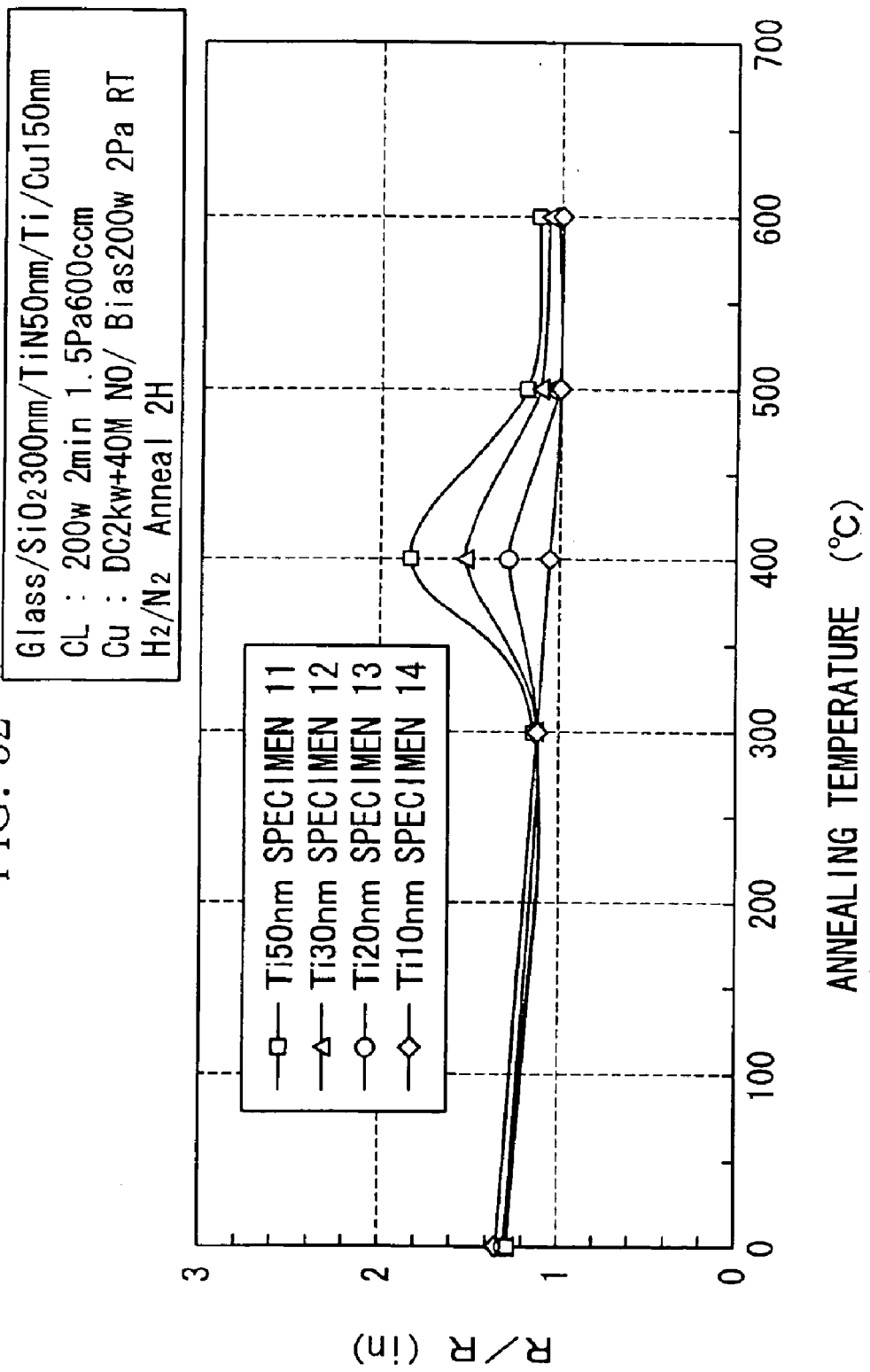
FIG. 32 is a graph showing the analyzed sheet resistance of the multi-layered film of specimens 11 to 14.

The sheet resistance of the multi-layered films of specimens 11 to 14 were analyzed, and the results are shown in FIG. 32. In FIG. 32, horizontal axis indicates the annealing temperature (° C.), while "R/R (in)" in the vertical axis indicates the ratio of the sheet resistance of the multi-layered film to the sheet resistance of the Cu film.

According to FIG. 32, in the specimens 11 and 12 in which a TiN film having a thickness of 50 nm and a Ti film having a thickness of 30 to 50 nm are provided between the SiO$_2$ and Cu films, the sheet resistance of the multi-layered film gradually increases after the annealing temperature exceeds 300° C., and the sheet resistance is largest at 400° C.

In contrast, the sheet resistance of the specimen 13, in which a TiN film having a thickness of 50 nm and a Ti film having a thickness of 20 nm are provided between the $SiO_2$ and Cu films, has less change of sheet resistance in comparison with specimens 11 and 12. On the other hand, in the specimen 14, in which a TiN film having a thickness of 50 nm and a Ti film having a thickness of 10 nm are provided between the $SiO_2$ and Cu films, the sheet resistance is almost fixed even though the annealing temperature is changed.

Therefore, with a Ti film having a thickness of 20 nm or less on the TiN film, wiring which has a lower resistance and whose resistance is not easily increased can be obtained.

As explained above, according to the present invention, when Cu (having low resistance) is used as a wiring material, preferable wiring, a TFT substrate using the same, a manufacturing method of the TFT substrate, and LCD can be provided, by which (i) oxidation resistance against water or oxygen, (ii) corrosion resistance against the etching material, resist-detaching solvent, and the like, and (iii) adhesion to the base can be improved, and inter-dispersion of the elements between adjacent films can be prevented.

What is claimed is:

1. A wire in a gate electrode in a thin film transistor, comprising: a Cu (Copper) layer having a bottom surface, a top surface and two side surfaces, wherein said bottom surface is on and in contact with a first coating film made of titanium, and the remaining three surfaces are coated by and in contact with a second coating film made of titanium oxide.

2. A TFT (thin film transistor) substrate having a wire as claimed in claim 1.

3. An LCD (liquid crystal display) comprising a pair of opposing substrates and a liquid crystal disposed between the opposing substrates, wherein at least one of the pair of opposing substrates is a TFT substrate as claimed in claim 2.

* * * * *